United States Patent
Irie

(10) Patent No.: US 6,901,567 B2
(45) Date of Patent: May 31, 2005

(54) METHOD OF PERFORMING TIMING-DRIVEN LAYOUT

(75) Inventor: Kazuyuki Irie, Kanagawa (JP)

(73) Assignee: NEC Electronics Corporation (JP)

( * ) Notice: Subject to any disclaimer, the term of this patent is extended or adjusted under 35 U.S.C. 154(b) by 19 days.

(21) Appl. No.: 10/404,339

(22) Filed: Apr. 1, 2003

(65) Prior Publication Data

US 2003/0204827 A1 Oct. 30, 2003

Related U.S. Application Data

(62) Division of application No. 09/995,518, filed on Nov. 28, 2001, now Pat. No. 6,584,607.

(30) Foreign Application Priority Data

Nov. 28, 2000 (JP) ........................................ 2000-361276

(51) Int. Cl.[7] .............................................. G06F 17/50
(52) U.S. Cl. ................................................ 716/5; 716/6
(58) Field of Search .................................. 716/5, 6, 10

(56) References Cited

U.S. PATENT DOCUMENTS

| | | | | |
|---|---|---|---|---|
| 4,694,403 A | * | 9/1987 | Nomura ........................... | 716/6 |
| 5,880,971 A | * | 3/1999 | Dangelo et al. ................. | 716/6 |
| 5,999,715 A | * | 12/1999 | Sato .............................. | 716/5 |
| 6,292,928 B1 | * | 9/2001 | Yamaguchi et al. .......... | 716/13 |
| 6,317,865 B1 | * | 11/2001 | Itoh .............................. | 716/11 |
| 6,487,705 B1 | * | 11/2002 | Roethig et al. ................. | 716/6 |
| 6,496,965 B1 | * | 12/2002 | van Ginneken et al. ...... | 716/10 |
| 6,507,938 B1 | * | 1/2003 | Roy-Neogi et al. ........... | 716/10 |
| 2002/0102066 A1 | * | 8/2002 | Nishita ........................ | 385/75 |
| 2002/0104066 A1 | * | 8/2002 | Irie .............................. | 716/11 |

* cited by examiner

*Primary Examiner*—Stacy A. Whitmore
(74) *Attorney, Agent, or Firm*—Hayes Soloway P.C.

(57) ABSTRACT

A timing-driven layout method is provided, which realizes timing error convergence toward zero without any timing constraint file. (a) An initial layout result is generated through placement of functional blocks of the circuit and routing of wiring lines therefor. (b) Wiring capacitance values of the respective blocks are calculated using the initial layout result. (c) Fan-out capacitance limitation values of the respective blocks are calculated using the wiring capacitance values of the blocks. Each of the fan-out capacitance limitation values represents a maximum fan-out capacitance value of a corresponding one of the blocks at which wiring-induced propagation delay of the block is equal to or less than a specific limitation value. (d) A driving capability of each of the blocks is compared with its fan-out capacitance limitation value, thereby generating a comparison result. (e) The blocks whose driving capabilities do not exceed their fan-out capacitance limitation values are defined as timing-error blocks based on the comparison result. (f) Circuit configuration of each of the timing-error blocks is changed based on its fan-out capacitance limitation value to decrease its propagation delay.

14 Claims, 12 Drawing Sheets

METHOD OF PERFORMING TIMING-DRIVEN LAYOUT

CROSS-REFERENCE TO RELATED APPLICATION

This Application is a divisional of U.S. application Ser. No. 09/995,518, filed Nov. 28, 2001, now U.S. Pat. No. 6,584,607 issued Jun. 24, 2003.

BACKGROUND OF THE INVENTION

1. Field of the Invention

The present invention relates to timing-driven layout for a circuit. More particularly, the invention relates to a method of performing timing-driven layout of a circuit that uses "fan-out capacitance limitation values" of the respective functional blocks of a circuit to find the timing-error blocks in these functional blocks, which is preferably used for layout of a Large-Scale Integrated circuit (LSI).

2. Description of the Related Art

In recent years, with the rapid increase in integration scale and operation speed of LSIs, it has become extremely difficult to decrease manually the number of timing errors in a LSI layout obtained by its placement and routing processes toward zero as desired. This means that it has become extremely difficult to realize manually the desired timing error convergence. To solve this problem, timing-driven layout methods have ever been developed to make it possible to automate the timing error convergence in the layout design operation.

Generally, "layout design" for LSIs means the design to form and allocate desired devices and their wiring lines on a chip, which has a hierarchical structure. Specifically, the "layout design" includes typically the "partitioning", "floor planning", "placement", and "routing" processes. The usual layout design is performed to minimize the chip area (i.e., maximize the integration level) and maximize the wiring efficiency. Unlike this, the "timing-driven layout design" is performed not only to minimize the chip area (i.e., maximize the integration level) and maximize the wiring efficiency but also to satisfy the timing constraints given.

"Partitioning", which is performed to decrease the complexity of overall layout, is a design process to group required gates and/or cells for a specific LSI into functional blocks to thereby divide the overall layout into "in-block layout" and "inter-block layout". This facilitates the subsequent design processes.

"Floor planning" is a design process to determine the schematic layout (i.e., schematic "in-block layout" and "inter-block layout") of the respective functional blocks formed through the partitioning process and the schematic layout of the wiring lines thereof. Due to "floor planning", the framework or skeletal structure of the LSI is determined.

"Placement" is a design process to determine the location and shape of the respective functional blocks.

"Routing" is a design process to determine the route or path of the wiring lines in and among the respective functional blocks.

FIG. 1 is a flowchart showing a typical example of the prior-art timing-driven layout methods of this type, which uses a timing constraint file that identifies the locations causing timing errors.

As shown in FIG. 1, in the step S101, initial placement of the functional blocks is performed based on the initial placement data. The initial placement data of the blocks are derived from the floor-planning data generated by a known method before the step S101. The routing process for wiring lines of the blocks is not performed at this stage.

In the step S102, a timing constraint file is formed by the timing constraint data generated from the initial placement data.

In the step S103, approximate propagation delay for the initial placement data is calculated.

In the step S104, it is judged whether the timing error convergence for the approximate propagation delay thus calculated is acceptable or not. If the judgment result in the step S104 is "No", the circuit configuration of the blocks and the placement thereof are corrected in the step S105 and then, the flow is returned to the step S102, repeating the steps S102 to S104. If the judgment result in the step S104 is "Yes", routing of the wiring lines for the blocks is performed in the step S106 and then, the wiring lines thus routed are corrected and adjusted according to the timing constraint data. The timing constraint data are generated from the timing constraint file.

In the step S10, it in judged whether the timing error convergence for the placement blocks and the routed wiring lines thus corrected and adjusted is acceptable or not. If the judgment result in the step S108 is "No", the flow is returned to the step S102, repeating the steps S102 to S104. If the result of judgment in the step S108 is "Yes", the flow is completed.

With the prior-art timing-driven layout method of FIG. 1, the timing constraint file (i.e., the timing constraint data) used to find the timing-error-causing locations is necessary. Thus, there is a problem that the identification behavior for the timing-error-causing locations and the content to be corrected or adjusted are largely affected by how the description of the timing constraint data is described.

Moreover, with the prior-art method of FIG. 1, wiring lengths are estimated or predicted to calculate the estimated propagation delay values and then, the timing-error-causing locations and the content for optimization are determined according to the estimated propagation delay values. Thus, some error or difference occurs between the actual wiring-induced delay values and the estimated wiring-induced delay values and as a result, there is another problem that accurate optimization is unable to be conducted.

Additionally, to eliminate the error between the actual and estimated wiring-induced delay values, the wiring lines needs to be changed or corrected after the placement and touting processes are completed. Therefore, the estimated wiring length differs from the actual wiring length and as a result, there is a possibility that timing error is not sufficiently converged as desired.

SUMMARY OF THE INVENTION

Accordingly, an object of the present invention is to provide a timing-driven layout method and a computer program product that make it possible to realize timing error convergence toward zero without any timing constraint file.

Another object of the present invention is to provide a timing-driven layout method and a computer program product that improves the timing-error convergence effect.

Still another object of the present invention is to provide a timing-driven layout method and a computer program product that makes it possible to change the circuit configuration for eliminating timing errors more correctly.

The above objects together with others not specifically mentioned will become clear to those skilled in the art from the following description.

According to a first aspect of the invention, a method of performing timing-driven layout of a circuit is provided, which comprises the steps of:
(a) generating an initial layout result through placement of functional blocks of the circuit and routing of wiring lines for the blocks;
(b) calculating wiring capacitance values of the respective blocks using the initial layout result;
(c) calculating fan-out capacitance limitation values of the respective blocks using the wiring capacitance values of the blocks calculated in the step (b);
each of the fan-out capacitance limitation values representing a maximum fan-out capacitance value of a corresponding one of the blocks at which wiring-induced propagation delay of the block is equal to or less than a specific limitation value;
(d) comparing a driving capability of each of the blocks with its fan-out capacitance limitation value, thereby generating a comparison result;
(e) defining the blocks whose driving capabilities do not exceed their fan-out capacitance limitation values as timing-error blocks based on the comparison result; and
(f) changing circuit configuration of each of the timing-error blocks based on its fan-out capacitance limitation value to decrease its propagation delay.

With the method of performing timing-driven layout of a circuit according to the first aspect of the invention, the initial layout result is generated in the step (a) through placement of functional blocks of the circuit and routing of wiring lines for the blocks. The wiring capacitance values of the respective blocks are calculated using the initial layout result generated in the step (b).

The fan-out capacitance limitation values for the respective blocks are calculated in the step (c). Each of the fan-out capacitance limitation values represents the maximum fan-out capacitance value of a corresponding one of the blocks at which wiring-induced propagation delay of the block is equal to or less than a specific limitation value.

Thereafter, the driving capability of each of the blocks is compared with its fan-out capacitance limitation value, thereby generating a comparison result in the step (d). The blocks whose driving capabilities do not exceed their fan-out capacitance limitation values are defined as the timing-error blocks based on the comparison result obtained in the step (e). Thereafter the circuit configuration of each of the timing-error blocks is changed based on its fan-out capacitance limitation value to decrease its propagation delay.

Accordingly, by repeating the steps (d) to (f) until the number of the timing-error blocks is decreased to a specific value nearby zero, timing error convergence can be realized without any timing constraint file.

Moreover, since only the circuit configuration of each of the timing-error blocks is changed in the step (f), the timing error convergence on a small value close to zero is accelerated, in other words, the timing error convergence effect is improved.

Furthermore, the initial layout result, which is generated through placement of the functional blocks of the circuit and routing of the wiring lines for the blocks in the step (a), is used for calculating the wiring capacitance values of the respective blocks in the step (b). Therefore, the change of the circuit configuration for eliminating timing errors is carried out more correctly in the step (f) than the case where estimated or predicted wiring capacitance values are used.

According to a second aspect of the invention, another method of performing timing-driven layout of a circuit is provided, which comprises the steps of:

(a) generating an initial layout result through placement of functional blocks of the circuit and routing of wiring lines for the blocks;
(b) calculating wiring capacitance values of the respective blocks using the initial layout result;
(c) calculating fan-out capacitance limitation values of the respective blocks using the wiring capacitance values of the blocks calculated in the step (b);
each of the fan-out capacitance limitation values representing a maximum fan-out capacitance value of a corresponding one of the blocks at which wiring-induced propagation delay of the block is equal to or less than a specific limitation value;
(d) forming a replaceable block library of replaceable functional blocks while taking their fan-out capacitance limitation values generated in the step (c) into consideration;
the replaceable blocks being divided into different block types each having a same function generated by different circuit configurations;
each of the block types having different propagation delay values and different driving capabilities;
(e) comparing a driving capability of each of the blocks with its fan-out capacitance limitation value, thereby generating a comparison result;
(f) defining the blocks whose driving capabilities do not exceed their fan-out capacitance limitation values as timing-error blocks based on the comparison result; and
(g) replacing each of the timing-error blocks with a corresponding one of the replaceable blocks having the same function to change its circuit configuration without changing its function, thereby decreasing its propagation delay.

With the method of performing timing-driven layout of a circuit according to the second aspect of the invention, approximately the same steps as those in the method according to the first aspect are carried out, except that the replaceable block library of the replaceable functional blocks is formed in the step (d) and then, it is used for changing the circuit configuration of the timing-error blocks in the step (g).

Accordingly, there are the same advantages as those in the method of the first aspect.

According to a third aspect of the invention, still another method of performing timing-driven layout of a circuit is provided. This method comprises the same process steps as the method of the first aspect, except that (i) the initial layout result is generated through placement of functional blocks of the circuit without routing of wiring lines for the blocks, and (ii) estimated or predicted wiring capacitance values of the respective blocks are used.

Specifically, the method of the third aspect of the invention comprises the steps of:
(a) generating an initial layout result through placement of functional blocks of the circuit;
(b) estimating wiring capacitance values of the respective blocks using the initial layout result;
(c) calculating fan-out capacitance limitation values for the respective blocks using the wiring capacitance values of the blocks intimated in the Stop (b);
each of the fan-out capacitance limitation values representing a maximum capacitance value of a corresponding one of the blocks at which wiring-induced propagation delay of the block is equal to or less than a specific limitation value;
(d) comparing a driving capability of each of the blocks with its fan-out capacitance limitation value, thereby generating a comparison result;

(e) defining the blocks whose wiring capacitance values do not exceed their fan-out capacitance limitation values as timing-error blocks based on the comparison result; and (f) changing circuit configuration of each of the timing-error blocks based on its fan-out capacitance limitation value to decrease its propagation delay.

With the method of performing Liming-driven layout of a circuit according to the third aspect of the invention, because of substantially the same reason as shown in the method of the first aspect, there are the same advantages as those of the method of the first aspect. However, the level of the advantages varies according to the estimation accuracy of the estimated wiring capacitance values in the step (b).

According to a fourth aspect of the invention, a further method of performing timing-driven layout of a circuit is provided. This method comprises the same process steps as the method of the second aspect, except that (i) the initial layout result is generated through placement of functional blocks of the circuit without routing of wiring lines for the blocks, and (ii) estimated or predicted wiring capacitance values of the respective blocks are used.

Specifically, the method of the fourth aspect of the invention comprises the steps of:

(a) generating an initial layout result through placement of functional blocks of the circuit;

(b) estimating wiring capacitance values of the respective blocks using the initial layout result;

(c) calculating fan-out capacitance limitation values of the respective blocks using the wiring capacitance values of the blocks estimated in the step (b);

each of the fan-out capacitance limitation values representing a maximum fan-out capacitance value of a corresponding one of the blocks at which wiring-induced propagation delay of the block is equal to or less than a specific limitation value;

(d) forming a replaceable block library of replaceable functional blocks while taking their fan-out capacitance limitation values of the blocks generated in the step (c) into consideration;

the replaceable blocks being divided into different block types each having a same function generated by different circuit configurations;

each of the block types having different propagation delay values and different driving capabilities;

(e) comparing a driving capability of each of the blocks with its fan-out capacitance limitation value, thereby generating a comparison result;

(f) defining the blocks whose driving capabilities do not exceed their fan-out capacitance limitation values as timing-error blocks based on the comparison result; and (g) replacing each of the timing-error blocks with a corresponding one of the replaceable blocks having the same function to change its circuit configuration without changing its function, thereby decreasing its propagation delay With the method of performing timing-driven layout of a circuit according to the fourth aspect of the invention, because of substantially the same reason as shown in the method of the second aspect, there are the same advantages as those of the method of the first aspect. However, the level of the advantages varies according to the estimation accuracy of the estimated wiring capacitance values in the step (b).

According to a fifth aspect of the present invention, a computer program product having a computer readable medium and a computer program recorded thereon is provided, the computer program being operable to perform a method of performing timing-driven layout of a circuit according to the first aspect, which is comprised of:

(a) code that generates an initial layout result through placement of functional blocks of the circuit and routing of wiring lines for the blocks;

(b) code that calculates wiring capacitance values of the respective blocks using the initial layout result;

(c) code that calculates fan-out capacitance limitation values of the respective blocks using the wiring capacitance values of the blocks calculated in the step (b);

each of the fan-out capacitance limitation values representing a maximum fan-out capacitance value of a corresponding one of the blocks at which wiring-induced propagation delay of the block is equal to or less than a specific limitation value;

(d) code that compares a driving capability of each of the blocks with its fan-out capacitance limitation value, thereby generating a comparison result;

(e) code that defines the blocks whose driving capabilities do not exceed their fan-out capacitance limitation values as timing-error blocks based on the comparison result; and (f) code that changes circuit configuration of each of the timing-error blocks based on its fan-out capacitance limitation value to decrease its propagation delay.

With the product according to the fifth aspect of the present invention, it is obvious that the method according to the first aspect is carried out.

According to a sixth aspect of the present invention, another computer program product having a computer readable medium and a computer program recorded thereon is provided, the computer program being operable to perform a method of performing timing-driven layout of a circuit according to the second aspect, which is comprised of:

(a) code that generates an initial layout result through placement of functional blocks of the circuit and routing of wiring lines for the blocks;

(b) code that calculates wiring capacitance values of the respective blocks using the initial layout result;

(c) code that calculates fan-out capacitance limitation values of the respective blocks using the wiring capacitance values of the blocks calculated in the step (b);

each of the fan-out capacitance limitation values representing a maximum fan-out capacitance value of a corresponding one of the blocks at which wiring-induced propagation delay of the block is equal to or less than a specific limitation value;

(d) code that forms a replaceable block library of replaceable functional blocks while taking their fan-out capacitance limitation values of the blocks generated in the step (c) into consideration;

the replaceable blocks being divided into different block types each having a same function generated by different circuit configurations;

each of the block types having different propagation delay values and different driving capabilities;

(e) code that compares a driving capability of each of the blocks with its fan-out capacitance limitation value, thereby generating a comparison result;

(f) code that defines the blocks whose driving capabilities do not exceed their fan-out capacitance limitation values as timing-error blocks based on the comparison result; and (g) code that replaces each of the timing-error blocks with a corresponding one of the replaceable blocks having the same function to change its circuit configuration without changing its function, thereby decreasing its propagation delay.

With the product according to the sixth aspect of the present invention, it is obvious that the method according to the second aspect is carried out.

According to a seventh aspect of the present invention, still another computer program product having a computer readable medium and a computer program recorded thereon is provided, the computer program being operable to perform a method of performing timing-driven layout of a circuit according to the third aspect, which is comprised of:

(a) code that generates an initial layout result through placement of functional blocks of the circuit;

(b) code that estimates wiring capacitance values of the respective blocks using the initial layout result;

(c) code that calculates fan-out capacitance limitation values for the respective blocks using the wiring capacitance values of the blocks estimated in the step (b);
   each of the fan-out capacitance limitation values representing a maximum capacitance value of a corresponding one of the blocks at which wiring-induced propagation delay of the block is equal to or less than a specific limitation value;

(d) code that compares a driving capability of each of the blocks with its fan-out capacitance limitation value, thereby generating a comparison result;

(e) code that defines the blocks whose wiring capacitance values do not exceed their fan-out capacitance limitation values as timing-error blocks based an the comparison result; and (f) code that changes circuit configuration of each of the timing-error blocks based on its fan-out capacitance limitation value to decrease its propagation delay.

With the product according to the seventh aspect of the present invention, it is obvious that the method according to the third aspect is carried out.

According to an eighth aspect of the present invention, a further computer program product having a computer readable medium and a computer program recorded thereon is provided, the computer program being operable to perform a method of performing timing-driven layout of a circuit according to the fourth aspect, which is comprised of:

(a) code that generates an initial layout result through placement of functional blocks of the circuit;

(b) code that estimates wiring capacitance values of the respective blocks using the initial layout result;

(c) code that calculates fan-out capacitance limitation values of the respective blocks using the wiring capacitance values of the blocks estimated in the step (b);
   each of the fan-out capacitance limitation values representing a maximum fan-out capacitance value of a corresponding one of the blocks at which wiring-induced propagation delay of the block is equal to or less than a specific limitation value;

(d) code that forms a replaceable block library of replaceable functional blocks while taking their fan-out capacitance limitation values of the blocks generated in the step (c) into consideration;
   the replaceable blocks being divided into different block types each having a same function generated by different circuit configurations;
   each of the block types having different propagation delay values and different driving capabilities;

(e) code that compares a driving capability of each of the blocks with its fan-out capacitance limitation value, thereby generating a comparison result;

(f) code that defines the blocks whose driving capabilities do not exceed their fan-out capacitance limitation values as timing-error blocks based on the comparison result; and (g) code that replaces each of the timing-error blocks with a corresponding one of the replaceable blocks having the same function to change its circuit configuration without changing its function, thereby decreasing its propagation delay.

With the product according to the eighth aspect of the present invention, it is obvious that the method according to the fourth aspect is carried out.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
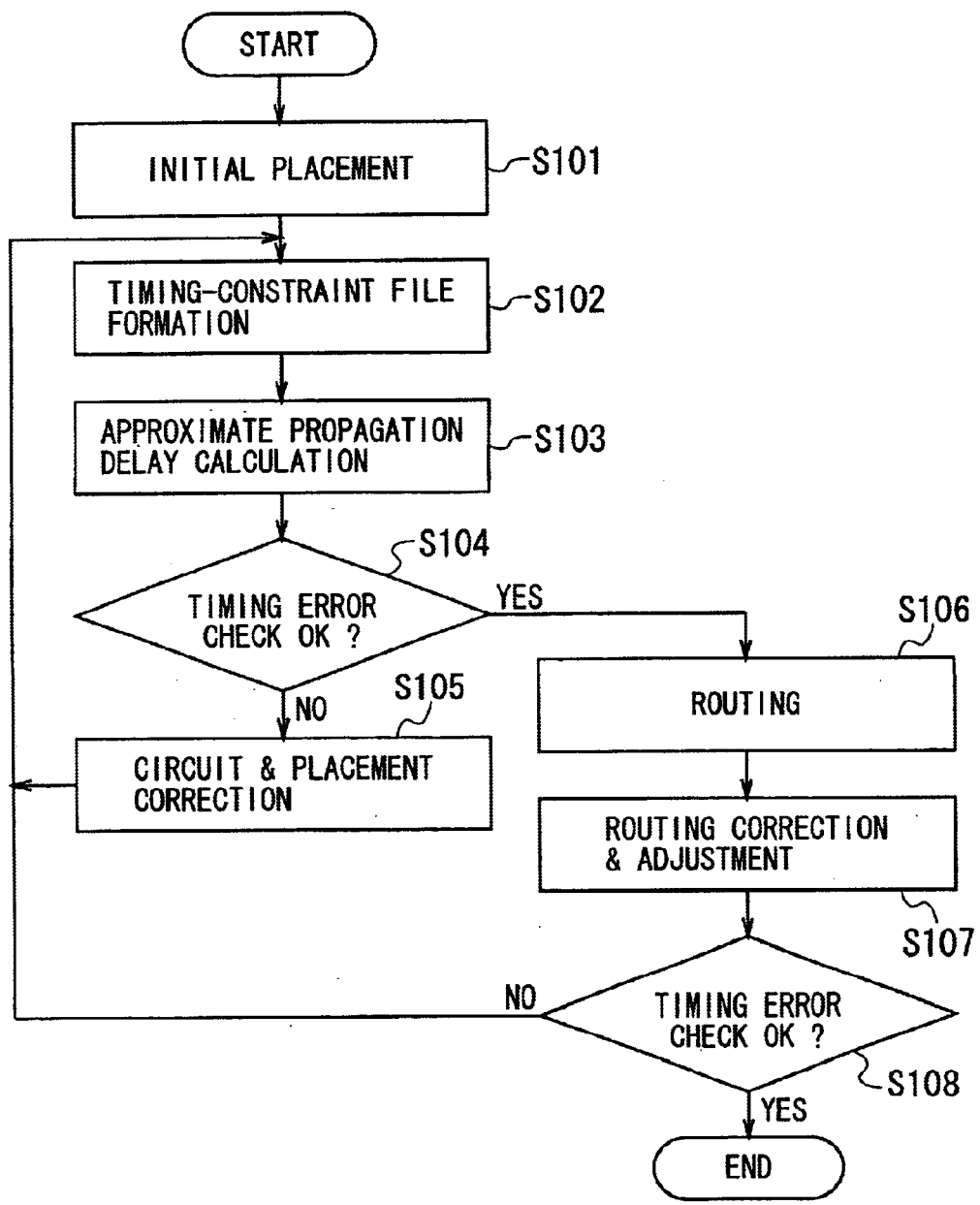
FIG. 1 is a flowchart diagram showing the process flow of a prior-art method of performing timing-driven layout of a LSI.

Preferred embodiments of the present invention will be described in detail below while referring to the drawings attached.

Prior to description of the preferred embodiments, definition of the wording used in this specification is presented here.

Definition

A "functional block" of a circuit or LSI is a block that generates a specific function with a specific circuit configuration. A specific number of the functional blocks are combined to realize the desired operation of the circuit or LSI.

The "functional block" comprises a specific circuit configuration to generate its function and has a specific "propagation delay" and a specific "driving capability". The "functional block" includes at least one circuit element (e.g., AND, OR, NAND, and NOR gates, buffers and inverters) and at least one output-side wiring line connected to an output terminal of the at least one circuit element.

The "propagation delay" of the functional block includes a "block-induced propagation delay" induced by the block itself or induced within the block, and a "wiring-induced propagation delay" induced by the at least output-side wiring line of the block.

A "fan-out capacitance limitation value" of the "functional block" represents a maximum tan-out capacitance value of the "functional block" at which the "wiring-induced propagation delay" is equal to or less than a specific limitation value.

It is most preferred that the "fan-out capacitance limitation value" is the fan-out capacitance value at which the "wiring-induced propagation delay" is minimized. In this case, however, it is extremely difficult or impossible to form a desired circuit or LSI while minimizing the "wiring-induced propagation delay" for every functional block. Therefore, here, the "fan-out capacitance limitation value" is defined as the maximum fan-out capacitance value at which the "wiring-induced propagation delay" is equal to or less-than a specific limitation value. Not to mention, the specific limitation value is typically set to be as small as possible.

It may be said that the "fan-out capacitance limitation value" of a "functional block" represents a maximum fan-out capacitance value of the "functional block" at which the "operation speed" of the block is equal to or greater than a specific limitation value. It is most preferred that the "fan-out capacitance limitation value" is the fan-out capacitance value at which the "operation speed" is maximized. In this case, however, it is extremely difficult or impossible to form a desired circuit or LSI while maximizing the "operation speed" for every functional block. Therefore, the "fan-out capacitance limitation value" may be defined as the maximum fan-out capacitance value at which the "operation speed" is equal to or greater than a specific limitation value. Not to mention, the specific limitation value is typically set to be as large as possible.

The following Table 1 shows an example of "fan-out capacitance limitation value", which indicates the concrete values of the fan-out capacitance, the fan-out error percentage, the propagation delay, the wiring-induced propagation delay, and the fan-out capacitance limitation (fan-out error delay) of an AND gate and a buffer. The "block-induced propagation delay" values of the AND gate and the buffer are 0.4 ns and 0.3 ns, respectively.

TABLE 1

|  | FAN-OUT CAPACITANCE | FAN-OUT ERROR PERCENTAGE | TOTAL PROPAGATION DELAY | WIRING-INDUCED PROPAGATION DELAY | FAN-OUT CAPACITANCE LIMITATION |
|---|---|---|---|---|---|
| AND | 1 pF | 100% | 1 ns | 0.6 ns | 0.4 pF |
| (0.4 | 0.8 pF | 80% | 0.7 ns | 0.3 ns |  |
| ns) | 0.6 pF | 60% | 0.6 ns | 0.2 ns |  |
|  | 0.4 pF | 40% | 0.5 ns | 0.1 ns |  |
|  | (0.3 pF) | (30%) | (0.5 ns) | (0.2 ns) |  |
| BUFFER | 4 pF | 100% | 1.5 ns | 1.2 ns | 2 pF |
| (0.3 | 3.5 pF | 87.5% | 1 ns | 0.7 ns |  |
| ns) | 3 pF | 75% | 0.8 ns | 0.5 ns |  |
|  | 2.5 pF | 62.5% | 0.6 ns | 0.3 ns |  |
|  | 2 pF | 50% | 0.4 ns | 0.1 ns |  |
|  | (1.5 pF) | (37.5%) | (0.4 ns) | (0.1 ns) |  |

In the example of Table 1, the fan-out capacitance of an AND gate (which forms a functional block) varies from 1 pF where the fan-out error percentage is 100% to 0.3 pF where the fan-out error percentage is 30%. This means that when the fan-out capacitance value is 1 pF, the fan-out error occurs at a possibility of 100% and that when the fan-out capacitance value is 0.3 pF, the fan-out error occurs at a possibility of 30%, The wiring-induced propagation delay of the AND gate varies from 0.6 ns to 0.1 ns according to the change of the fan-out capacitance from 1 pF to 0.3 pF. On the other hand, the block-induced propagation delay of the AND gate is kept at 0.4 ns. Therefore, the total propagation delay (i.e., the sum of the block-induced propagation delay and the wiring-induced propagation delay) of the AND gate ranges from 1 ns to 0.5 ns according to the change of the fan-out capacitance from 1 pF to 0.3 pF.

In the AND gate of Table 1, the minimum value of the wiring-induced propagation delay (i.e., the maximum value of the operation speed) is 0.1 ns, which occurs at the fan-out capacitance of 0.4 pF or 0.3 pF. Taking the above-described definition of the fan-out capacitance limitation value (i.e., the maximum fan-out capacitance value at which the wiring-induced propagation delay is equal to or less than a specific limitation value) into account, the fan-out capacitance limitation value of the AND gate is set at 0.4 pF.

Although not shown in Table 1, the fan-out capacitance of the AND gate may be decreased to be lower than 0.3 pF according to the decrease of the fan-out capacitance. In this case, however, the wiring-induced propagation delay is kept at 0.1 ns and therefore, the fan-out capacitance limitation value of the AND gate is kept at 0.1 ns as well.

Similarly, in the example of Table 1, the fan-out capacitance of a buffer (which forms a functional block) varies from 4 pF where the fan-out error percentage is 100% to 1.5 pF where the fan-out error percentage is 37.5%. This means that when the fan-out capacitance value is 4 pF, the fan-out error occurs at a possibility of 100% and that when the fan-out capacitance value is 1.5 pF, the fan-out error occurs at a possibility of 37.5%, The wiring-induced propagation delay of the buffer varies from 1.2 ns to 0.1 ns according to the change of the fan-out capacitance from 4 pF to 1.5 pF. On the other hand, the block-induced propagation delay of the buffer is kept at 0.3 ns. Therefore, the total propagation delay (i.e., the sum of the block-induced propagation delay and the wiring-induced propagation delay) of the buffer ranges from 1.5 ns to 0.4 ns according to the change of the fan-out capacitance from 4 pF to 1.5 pF.

In the buffer of Table 1, the minimum value of the wiring-induced propagation delay (i.e., the maximum value of the operation speed) is 0.1 ns, which occurs at the fan-out capacitance of 2 pF or 1.5 pF. Taking the above-described definition of the fan-out capacitance limitation value (ire., the maximum fan-out capacitance value at which the wiring-induced propagation delay is equal to or less than a specific limitation value) into account, the fan-out capacitance limitation value of the buffer is set at 2 pF.

Although not shown in Table 1, the fan-out capacitance of the buffer may be decreased to be lower than 1.5 pF according to the decrease of the fan-out capacitance. In this case, however, the wiring-induced propagation delay is kept at 0.1 ns and therefore, the fan-out capacitance limitation value of the buffer is kept at 0.1 ns as well.

In the AND gate of Table 1, the wiring-induced propagation delay of 0.1 ns at the fan-out error percentage of 40% is used as the fan-out error limitation value. In the buffer of Table 1, the wiring-induced propagation delay of 0.1 ns at the fan-out error percentage of 50% is used as the fan-out error limitation value. However, the invention is not limited to these examples. The fan-out error limitation value may be defined optionally at an appropriate value of the fan-out error percentage if the propagation delay or the operation speed of a circuit element or a functional block is sufficient for realizing a given specification.

In addition, the word "fan-out limitation" of a functional block has been used popularly in the same technical field of the invention. The "fan-out limitation" means that the limit of the fan-out of a functional block (i.e., the maximum number of next-stage functional blocks connectable to the output of a functional block in question). The fan-out limitation of a functional block is generated by the fact that the waveform of an electrical signal becomes dull during propagation within the block and thus, the block becomes unable to operate normally. Accordingly, the popular "fan-out limitation" is quite different from the word "fan-out capacitance limitation" in the invention.

First Embodiment

Figure 2:
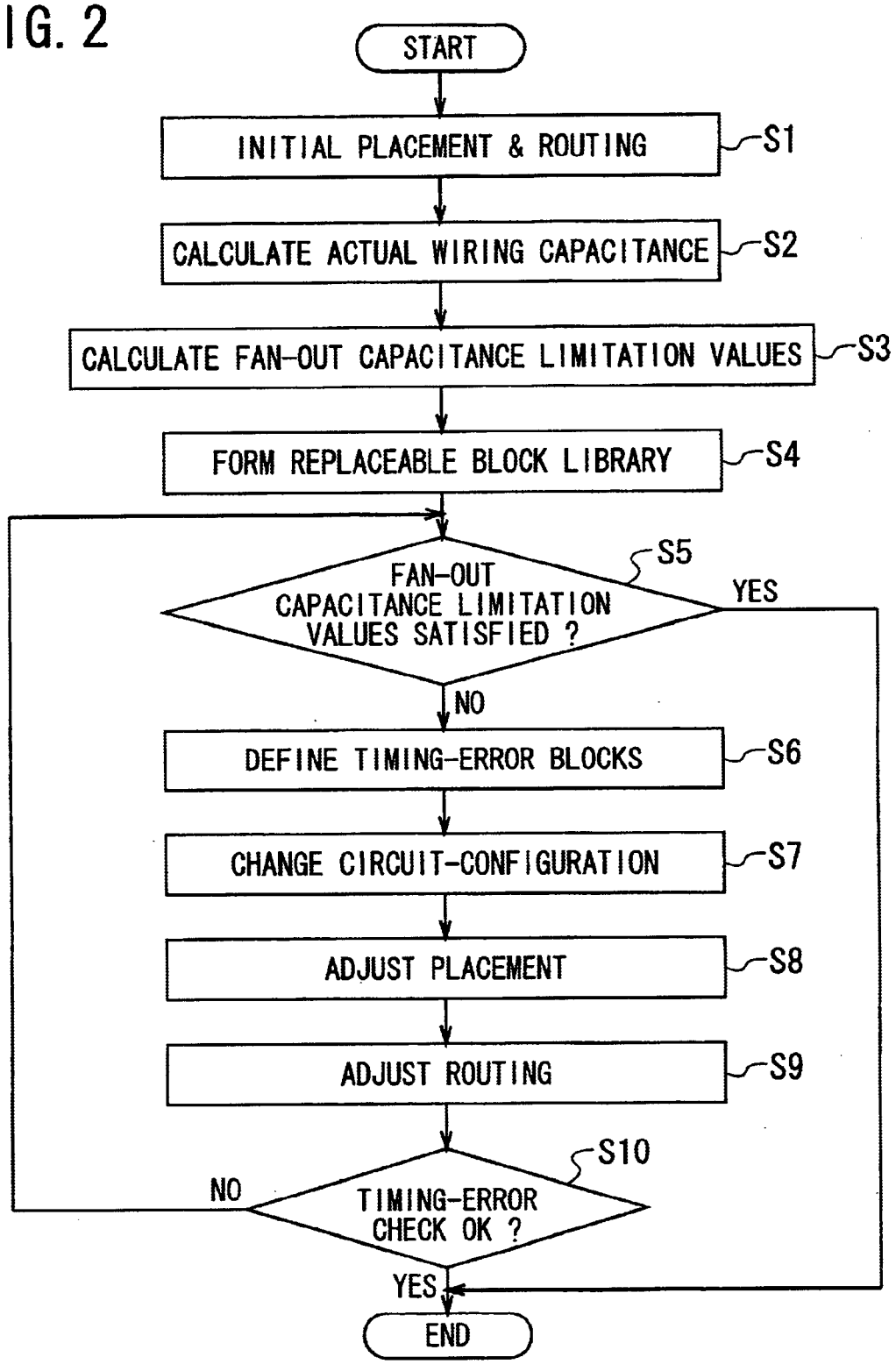
FIG. 2 is a flowchart diagram showing the process flow of a method of performing timing-driven layout of a LSI according to a first embodiment of the invention.

A method of performing timing-driven layout of a LSI according to a first embodiment of the invention is shown in FIG. 2. This method is carried out with a popular automatic layout tool for LSIs or a computer-aided design (CAD) system.

In the step S1, initial placement and routing is performed by a known method according to the specific, desired circuit functions or operations of a LSI, thereby forming an "initial layout result". This initial placement and routing process is usually carried out automatically. However, it may be carried out manually.

Not only placement of the functional blocks but also routing of the wiring lines for these blocks are carried out in the step S1. This is different from the prior-art method of FIG. 1 where only placement of the functional blocks is carried out at this stage and thereafter, routing of the wiring lines is carried out. Thus, the initial layout result obtained in the step S1 includes not only the placement data of the functional blocks but also the wiring data thereof.

In the step S2, the actual wiring capacitance of each of the functional blocks thus placed in the step S1 is calculated from the initial layout result obtained in the step S1. In other words, actual wiring capacitance of each functional block is calculated using the actual wiring lines that have been determined in the step S1.

In the step S3, the fan-out capacitance limitation values of the respective functional blocks are calculated using the actual wiring lines that have been determined in the step S1 and then, these values are stored in a memory device such as a hard disk drive (not shown) of the tool or CAD system as a library. Preferably, the library of the fan-out capacitance limitation values is made in the form of table. The fan-out capacitance limitation value is made for each output terminal of the block. Each of the fan-out capacitance limitation values represents the maximum operation Speed of a corresponding one of the blocks.

In the step S4, a replaceable block library of replaceable functional blocks is formed or prepared. This process is carried out while taking the fan-out capacitance limitation values of the functional blocks into consideration.

The replaceable blocks are divided into different block types each having a same function generated by different circuit configurations. Each of the block types has different propagation delay values and different driving capabilities.

Figure 4:
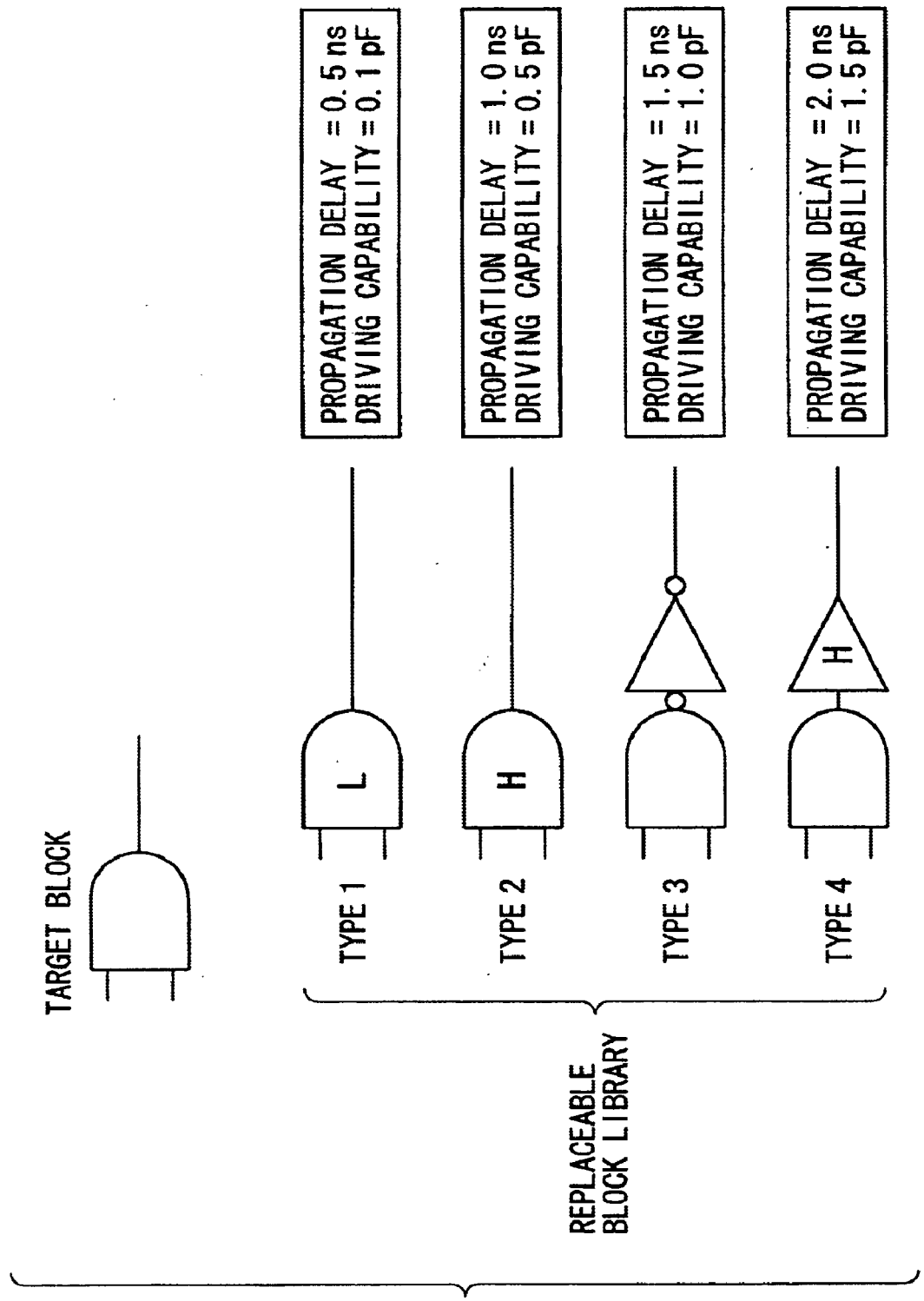
FIG. 4 is a schematic illustration showing an example of the replaceable block library used in the methods of the invention.

FIG. 4 shows an example of the replaceable block library formed in the step S4.

As shown in FIG. 4, it is supposed that a target functional block is formed by one AND gate and includes timing error. The replaceable blocks are divided into four block types (Types 1, 2, 3, and 4) each having the same function generated by different circuit configurations, i.e., different circuit elements. Each of Types 1, 2, 3 and 4 has different propagation delay values and different driving capabilities.

Specifically, as seen from FIG. 4, the replaceable block of Type 1 includes one AND gate with a propagation delay of 0.5 ns and a low driving capability of 0.1 pF, which means as follows:

The replaceable block of Type 1 operates at high speed in such a way that the propagation delay is restricted to 0.5 ns or less, if the fan-out capacitance limitation value of the Type 1 block is equal to or less than 0.1 pF. Is the fan-out capacitance limitation value of the Type 1 block is greater than 0.1 pF, the wiring-induced propagation delay increases rapidly and as a result, the propagation delay of the Type 1 block exceeds 0.5 ns vastly.

Therefore, for example, the Type 1 block is used to decrease the current driving capability value of the target block toward 0.1 pF to clear the fan-out capacitance limitation value of the target block, thereby decreasing the propagation delay of the target block, i.e., increasing the operation speed thereof.

Similarly, the replaceable block of Type 2 includes one AND gate with a propagation delay of 1.0 ns and a high driving capability of 0.5 pF. The Type 2 block operates at high speed in such a way that the propagation delay is restricted to 1.0 ns or less, if the fan-out capacitance limitation value is equal to or less than 0.5 pF. If the fan-out capacitance limitation value of the Type 2 block is greater than 0.5 pF, the wiring-induced propagation delay increases rapidly and as a result, the propagation delay of the Type 2 block exceeds 1.0 ns vastly.

Therefore, for example, the Type 2 block is used to increase the driving capability of the target block toward 0.5 pF to clear its fan-out capacitance limitation value, thereby decreasing the propagation delay of the target block, i.e., increasing the operation speed thereof.

The replaceable block of Type 3 includes one NAND gate and one inverter, and has a propagation delay of 1.5 ns and a driving capability of 1.0 pF. The Type 3 block operates at high speed in such a way that the propagation delay is restricted to 1.5 ns or less, if the fan-out capacitance limitation-value is equal to or less than 1.0 pF. If the fan-out capacitance limitation value is greater than 1.0 pF, the wiring-induced propagation delay increases rapidly and as a result, the propagation delay of the Type 3 block exceeds 1.5 ns vastly.

Therefore, for example, the Type 3 block is used to increase the driving capability of the target block to be over 0.5 pF to clear the fan-out capacitance limitation value, thereby decreasing the propagation delay of the target block, i.e., increasing the operation speed thereof.

The replaceable block of Type 4 includes one AND gate and a buffer, and has a propagation delay of 2.0 ns and a driving capability of 1.5 pF. The Type 4 block operates at high speed in such a way that the propagation delay is restricted to 2.0 ns or less, if the fan-out capacitance limitation value is equal to or less than 1.5 pF. If the fan-out capacitance limitation value is greater than 1.5 pF, the wiring-induced propagation delay increases rapidly and as a result, the propagation delay of the Type 4 block exceeds 2.0 ns vastly.

Therefore, for example, the Type 4 block is used to increase the driving capability of the target block to be over 1.0 pF to clear the fan-out capacitance limitation value, thereby decreasing the propagation delay of the target block, i.e., increasing the operation speed thereof.

Since the propagation delay values of the replaceable blocks of Types 1, 2, 3, and 4 in FIG. 4 increase gradually, it may be said that these blocks are arranged in the replaceable block library in the ascending order of the propagation delay. Moreover, since the driving capability values of the replaceable blocks of Types 1, 2, 3, and 4 increase gradually as well, it may be said that these blocks are arranged in the library in the ascending order of the driving capability.

An example of replacing the target block of AND with one of the Block Types 1 to 4 of FIG. 4 is shown in Table 2 below.

TABLE 2

| FAN-OUT CAPACITANCE (pF) | MAXIMUM PROPAGATION DELAY (ns) (FAN-OUT ERROR %) | | | | FAST- EST TYPE |
|---|---|---|---|---|---|
| | TYPE 1 (AND, LOW) | TYPE 2 (AND, HIGH) | TYPE 3 (NAND + INVERTER) | TYPE 4 (AND + BUFFER) | |
| 0 < 1 | 0.5 (30%) | 0.6 (15%) | 1.0 (7%) | 1.5 (4%) | TYPE 1 |
| 1 < 2 | 1.4 (60%) | 0.9 (30%) | 1.3 (15%) | 1.6 (8%) | TYPE 2 |
| 2 < 3 | 2.8 (90%) | 1.8 (60%) | 1.5 (30%) | 1.7 (5%) | TYPE 3 |
| 3 < 4 | 5.6 (120%) | 3.6 (90%) | 2.0 (60%) | 1.2 (30%) | TYPE 4 |

In Table 2, when the fan-out capacitance value (i.e., the sum of the wiring-induced capacitance and the fan-in capacitance) of the target block of AND is between 0 and 1 pF, the Type 1 to 4 blocks have the maximum propagation delay values of 0.5, 0.6, 1.0, and 1.5 (ns), respectively. In this case, the Type 1 block is the fastest in operation speed and therefore, it is chosen as the block to be replaced.

Similarly, when the fan-out capacitance value of the target block of AND is between 1 and 2 pF, the Type 1 to 4 blocks have the maximum propagation delay values of 1.4, 0.9, 1.3, and 1.6 (ns), respectively. In this case, the Type 2 block is the fastest in operation speed and therefore, it is chosen as the block to be replaced.

When the fan-out capacitance value of the target block of AND is between 2 and 3 pF, the Type 1 to 4 blocks have the maximum propagation delay values of 2.8, 1.8, 1.5, and 1.7 (ns), respectively. In this case, the Type 3 block is the fastest in operation speed and therefore, it is chosen as the block to be replaced.

When the fan-out capacitance value of the target block of AND is between 3 and 4 pF, the Type 1 to 4 blocks have the maximum propagation delay values of 5.6, 3.6, 2.0, and 1.8 (ns), respectively. In this case, the Type 4 block is the fastest in operation speed and therefore, it is chosen as the block to be replaced.

In the step S5, it is judged whether or not the driving capability value of each of the functional blocks according to the initial layout result generated in the step S1 is satisfied with a corresponding one of the fan-out capacitance limitation values calculated in the step S3. In other words, the driving capability value of each block is compared with its fan-out capacitance limitation value, thereby generating a comparison result.

If the result in the step S5 is "YES", all the functional blocks in the initial layout result include no timing error. Thus, the flow is completed. This means that the initial layout is acceptable. However, this is quite rare. Usually, the result in the step S5 is "NO" and thus, the following step S6 is carried out.

In the step S6, the functional blocks whose driving capability values are not satisfied with their fan-out capacitance limitation values are defined as "timing-error blocks". This is based on the comparison result generated in the step S5. The "timing-error blocks" are the ones that have unacceptable propagation delay values to cause timing error on operation.

In the step 57, the circuit configuration of each timing-error block is changed or corrected according to the corresponding fan-out capacitance limitation value to decrease its propagation delay and to increase its operation speed. This circuit configuration change or correction is carried out in such a way that the driving capability of each timing-error block is equal to or greater then its own fan-out capacitance limitation value. In the method of the first embodiment, the replaceable block library shown in FIG. 4 is used for this purpose. However, any other method may be used therefor.

For example, if the fan-out capacitance limitation value of the target block (which is one of the timing-error blocks) of FIG. 4 is 0.2 pF, the target block can be replaced with the Type 2, Type 3, or Type 4 block. In this case, it is most preferred that the target block is replaced with the Type 2 block compared with the Type 3 and 4 blocks, because the propagation delay of the replaced or corrected target block is limited to the shortest value of 1.0 ns or less. Thus, the timing error of the target block is eliminated.

If the fan-out capacitance limitation value of the target block of FIG. 4 is 0.7 pF, the target block may be replaced with the Type 3 or Type 4 block. In this case, it is more preferred that the target block is replaced with the Type 3 block compared with the Type 4 block, because the propagation delay of the replaced or corrected target block is limited to the shorter value of 1.5 ns or less. Thus, the timing error of the target block is eliminated.

If the fan-out capacitance limitation value of the target block of FIG. 4 is 1.2 pF, the target block is replaced with the Type 4 block. In this case, the propagation delay of the replaced or corrected target block is limited to the shorter value of 2.0 ns or less. Thus, the timing error of the target block is eliminated.

FIGS. 5 to 8 show other examples of the circuit-configuration change of the target block with timing error in the method of the first embodiment.

Figure 5:
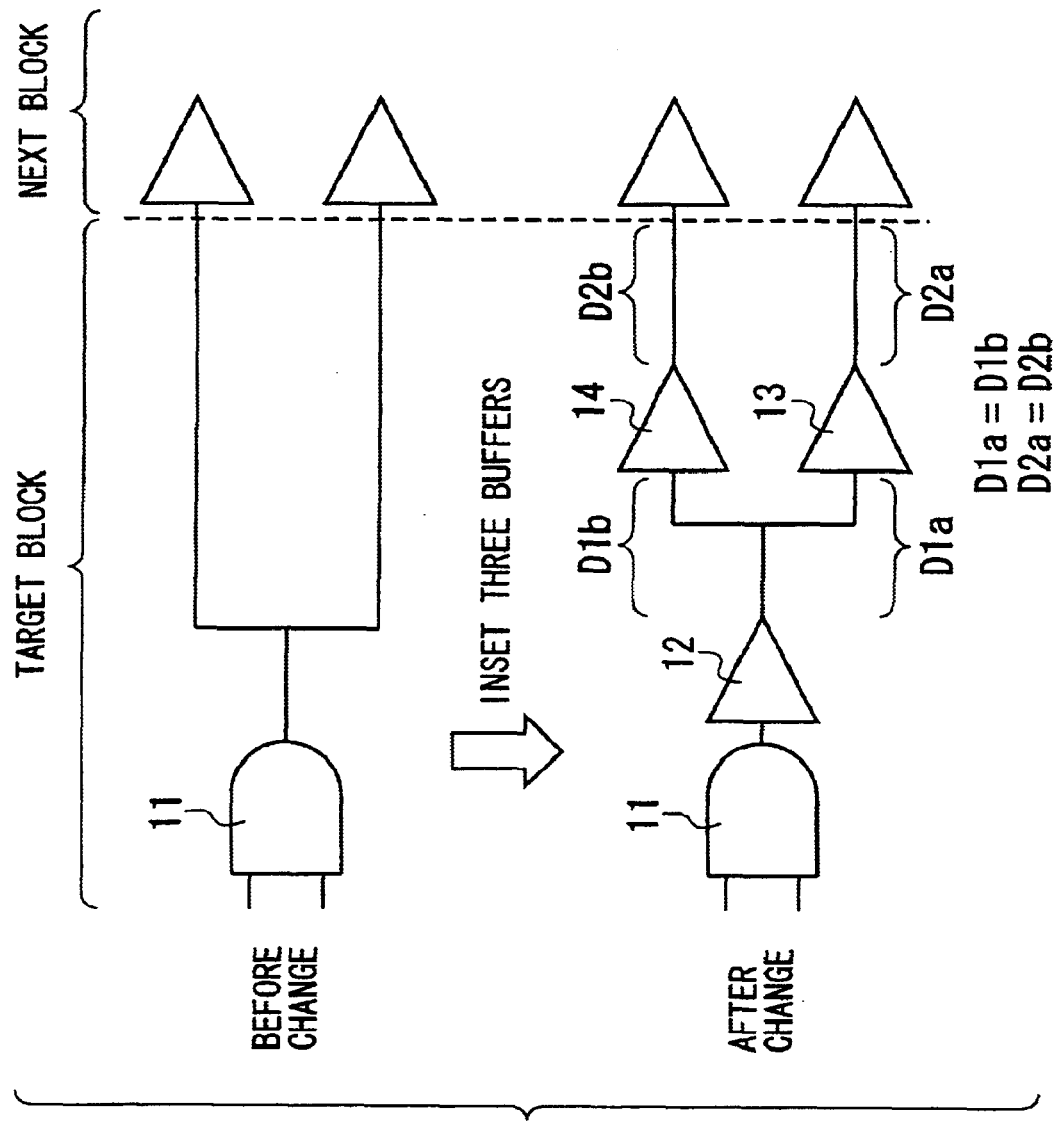
FIG. 5 is a schematic illustration showing an example of circuit-configuration change of the target block in the methods of the invention, in which three buffers are inserted or added to the output of the AND gate in the target block.

In FIG. 5, the target block is formed by an AND gate 11 and has the fan-out number of two. The circuit configuration of the target block is changed by inserting or adding three buffers 11, 12, and 13 to the output of the AND gate 11. The buffer 12 is located near the output terminal of the AND gate 11 and the buffers 13 and 14 are located on the branched wiring lines of the gate 11, respectively.

The distance D1a between the buffers 12 and 13 and the distance D1b between the buffers 12 and 14 are set to be equal. Similarly, the distance D2a between the buffer 13 and the input of the corresponding buffer of the next block and the distance D2b between the buffer 14 and the input of the corresponding buffer of the next block are set to be equal. This is to prevent bad effects caused by the difference of the propagation delay values along the branched wiring lines of the gate 11.

The circuit-configuration change of the target block of FIG. 5 may be said that the AND gate 11 is replaced with the combination of the AND gate 11 and the three buffers 12, 13, and 14.

Figure 6:
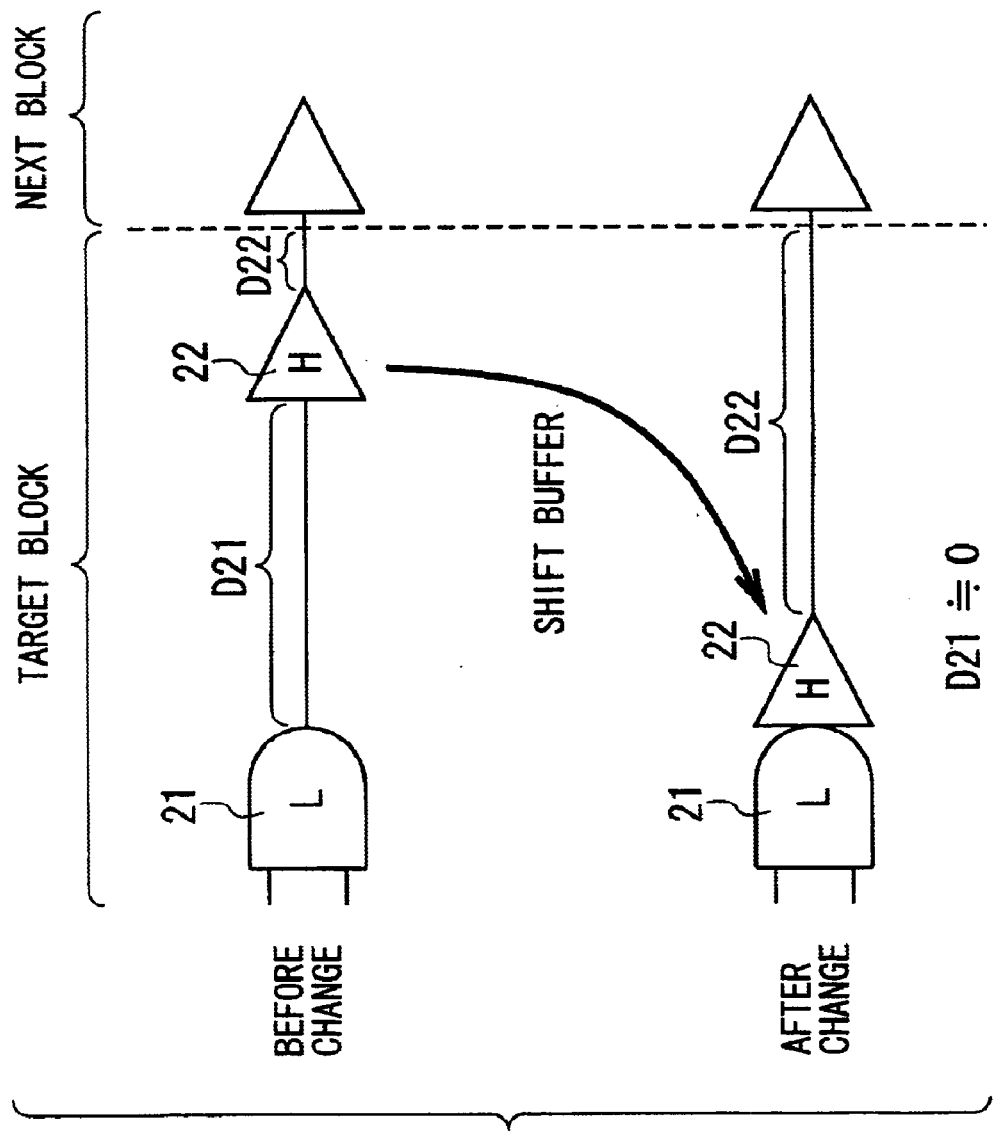
FIG. 6 is a schematic illustration showing an example of circuit-configuration change of the target block in the methods of the invention, in which the buffer with high driving capability is shifted toward the output of the AND gate with low high driving capability in the target block.

In FIG. 6, the target block is formed by an AND gate 21 with low driving capability and a buffer 22 with high driving capability. The circuit configuration of the target block is changed by shifting the position of the buffer 22 toward the AND gate 21. As a result, the distance D21 between the gate 21 and the buffer 22 is decreased to approximate zero while the distance D22 between the buffer 22 and the input of the next block is increased by the shifted distance.

Before change, the AND gate 21 with low driving capability is apart from the buffer 22 with high driving capability and therefore, there is a possibility that the driving capability of the gate 21 is insufficient for driving the buffer 22 and the wiring line between the gate 21 and the buffer 22. On the other hand, the driving capability of the buffer 22 is excessively high. As a result, to eliminate this irrational layout, the circuit change of FIG. 6 is carried out.

The circuit-configuration change of the target block-of FIG. 6 may be said that the combination of the AND gate 21 and the buffer 22 apart from each other is replaced with the combination of the AND gate 21 and the adjacent buffer 22.

Figure 7:
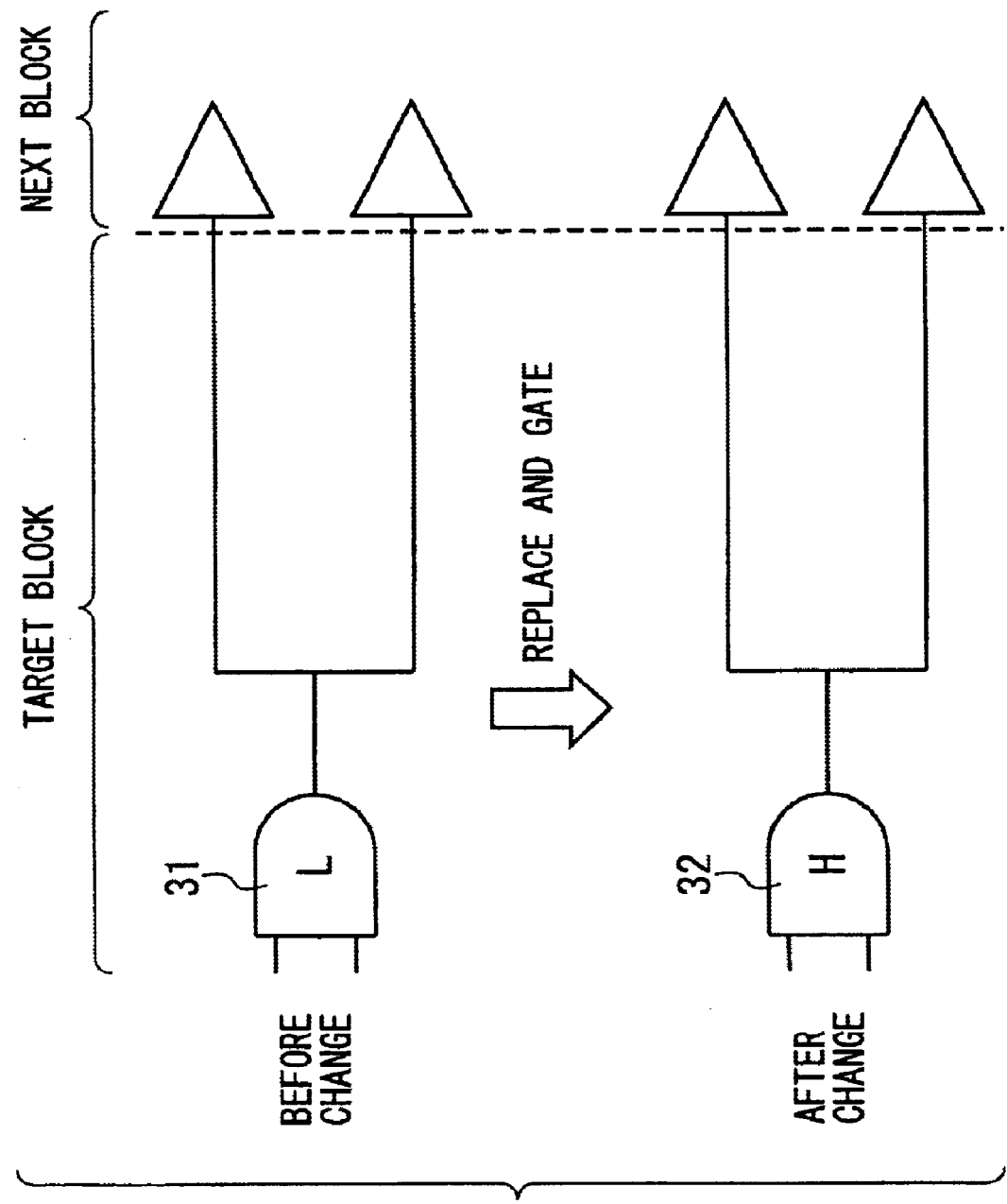
FIG. 7 is a schematic illustration showing an example of circuit-configuration change of the target block in the methods of the invention, in which the AND gate with low high driving capability is replaced with an AND gate with high driving capability in the target block.

In FIG. 7, the target block is formed by an AND gate 31 with low driving capability and has the fan-out number of two. The circuit configuration of the target block is changed by replacing the gate 31 with an AND gate 32 with high driving capability.

Figure 8:
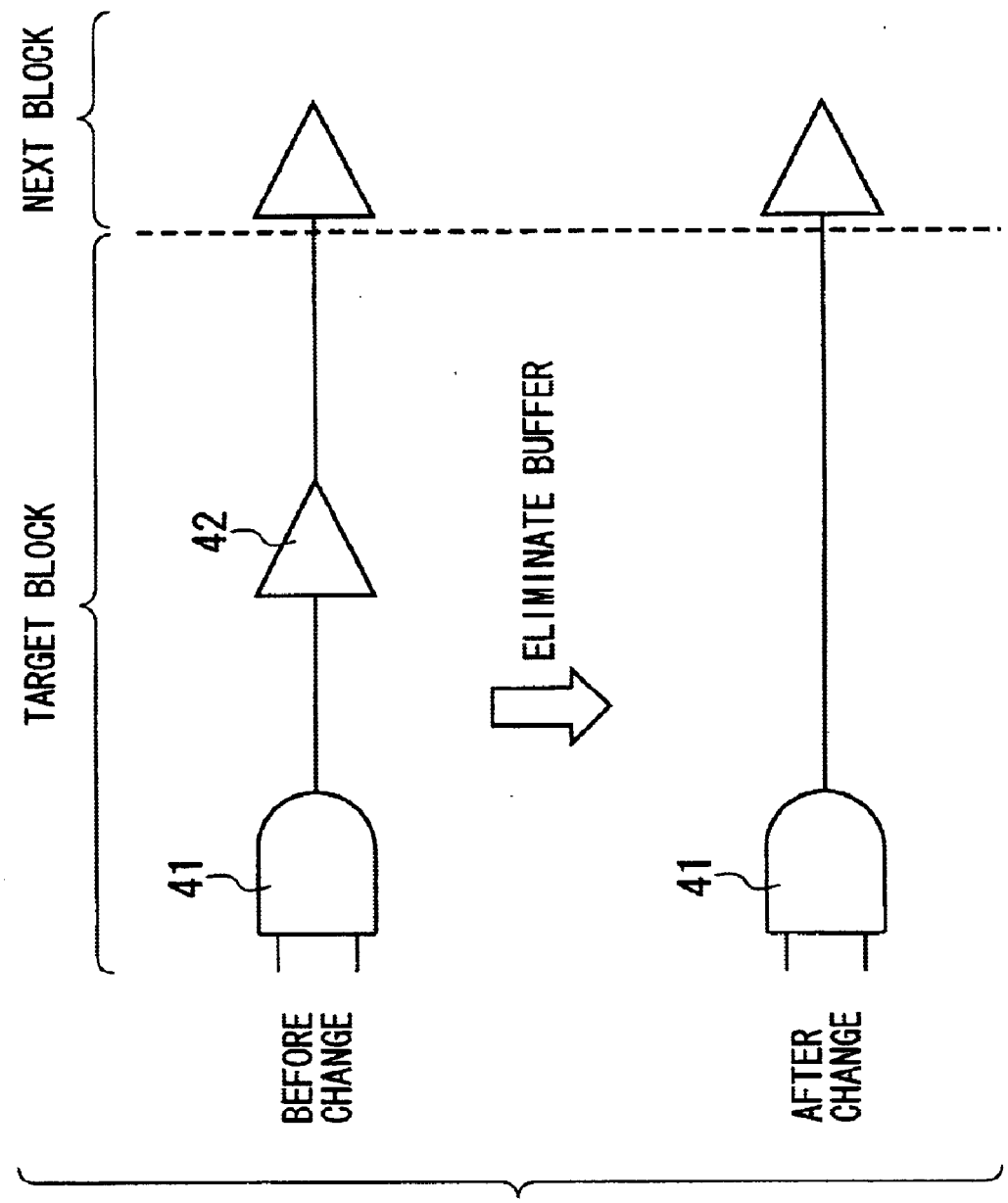
FIG. 8 is a schematic illustration showing an example of circuit-configuration change of the target block in the methods of the invention, in which the buffer is eliminated in the target block.

In FIG. 8, the target block in formed by an AND gate 41 and a buffer 42. The circuit configuration of the target block is changed by simply eliminating or removing the buffer 42. This is to decrease the propagation delay value of the target block.

Also, the circuit configuration change of FIG. 8 is effective when the AND gate 41 has an extra driving capability from the viewpoint of its fan-out capacitance limitation value. In this case, not only the circuit configuration of the target block is simplified but also the chip area of the target block can be reduced by the area for the buffer 42. This leads to chip-area reduction of all the functional blocks of the LSI.

Whether or not the functional block has an extra driving capability from the viewpoint of its fan-out capacitance limitation value can be judged based on the fact that the difference between the driving capability and the fan-out capacitance limitation value of the functional blocks (which are not the timing-error blocks) is equal to or greater than a specific reference value.

It is preferred that the circuit configurations of FIGS. 5 to 8 are stored in the replaceable block library as previously explained with reference to FIG. 4.

Although not shown here, there are any other circuit-configuration changes of the target block according to the necessity.

Now, the explanation is returned to the step S8 of FIG. 2.

In the step S8, the initial placement of the functional blocks is adjusted to accord with the corrected or changed circuit configuration of the timing-error blocks generated in the step S7. This is realized by changing the initial layout through amendment of the initial net list to accord with the corrected or changed circuit configuration, or by changing the initial layout data to accord with the corrected or changed circuit configuration.

In the step S9, the initial routing of the wiring lines for the initial functional blocks is adjusted to accord with the corrected or changed circuit configuration of the timing-error blocks generated in the step S7.

In the step S10, timing check or inspection is carried out to judge whether or not the number of the timing-error blocks is decreased to the specific number close to zero. If the judgment result in the step S10 is "YES", the flow is completed. If the judgment result in the step S10 is "NO", the flow is returned to the step S5 and then, the steps S5 to S10 are carried out again. In the second time performance, if the judgment result in the step S10 is "YES", the flow is completed. If the judgment result in the step S10 is "NO", the flow is returned to the step S5 and then, the steps S5 to S10 are carried out until the result is "YES" in the step S10.

When the judgment result in the step S10 is "YES", the method of the first embodiment is completed and it is judged that the timing error has converged.

With the method of performing timing-driven layout of a LSI according to the first embodiment of FIG. 2, the initial layout result is generated in the step S1 through placement of the functional blocks of the LSI and routing of the wiring lines for the blocks. Then, the actual wiring capacitance values of the respective blocks are calculated in the step S2 using the initial layout result thus generated.

The fan-out capacitance limitation values for the respective blocks are calculated in the step S3. Each of the fan-out capacitance limitation values represents the maximum capacitance value of a corresponding one of the blocks at which wiring-induced propagation delay is equal to or less than a specific limitation value.

On the other hand, the replaceable block library of the replaceable functional blocks (see FIG. 4) is formed in the step S4 while taking their fan-out capacitance limitation values generated in the step S3 into consideration. The replaceable blocks are divided into the different block types each having the same function generated by different circuit configurations. Each of the block types has different propagation delay values and different driving capabilities.

Thereafter, in the step S5, the driving capability of each of the blocks according to the initial layout result is compared with its fan-out capacitance limitation value, thereby generating the comparison result. In the step S6, the functional blacks whose driving capabilities do not exceed their fan-out capacitance limitation values are defined as the "timing-error blocks" based on the comparison result obtained in the step S5. Thereafter, in the step S7, the circuit configuration of each of the timing-error blocks is changed based on its fan-out capacitance limitation value to decrease its propagation delay.

According to the changed or corrected circuit configuration of the timing-error blocks, the initial placement and the initial routing are adjusted in the steps S8 and S9, respectively, thereby decreasing the number of the timing-error blocks.

Consequently, by repeating the steps S5 to S10 until the number of the timing-error blocks is decreased to the specific limitation value nearby zero, timing error convergence can be realized-without any timing constraint file.

Moreover, since only the circuit configuration of the timing-error blocks is changed in the step S7, the timing error convergence on the small limitation value close to zero is accelerated, in other words, the timing error convergence effect is improved.

Furthermore, the initial layout result, which is generated through placement of the functional blocks of the circuit and routing of the wiring lines for the blocks in the step S1, is used for calculating the actual wiring capacitance values of the respective blocks in the step S2. Therefore, the change of the circuit configuration for eliminating timing errors is carried out more correctly in the step S7 than the case where estimated or predicted wiring capacitance values are used.

Second Embodiment

Figure 3:
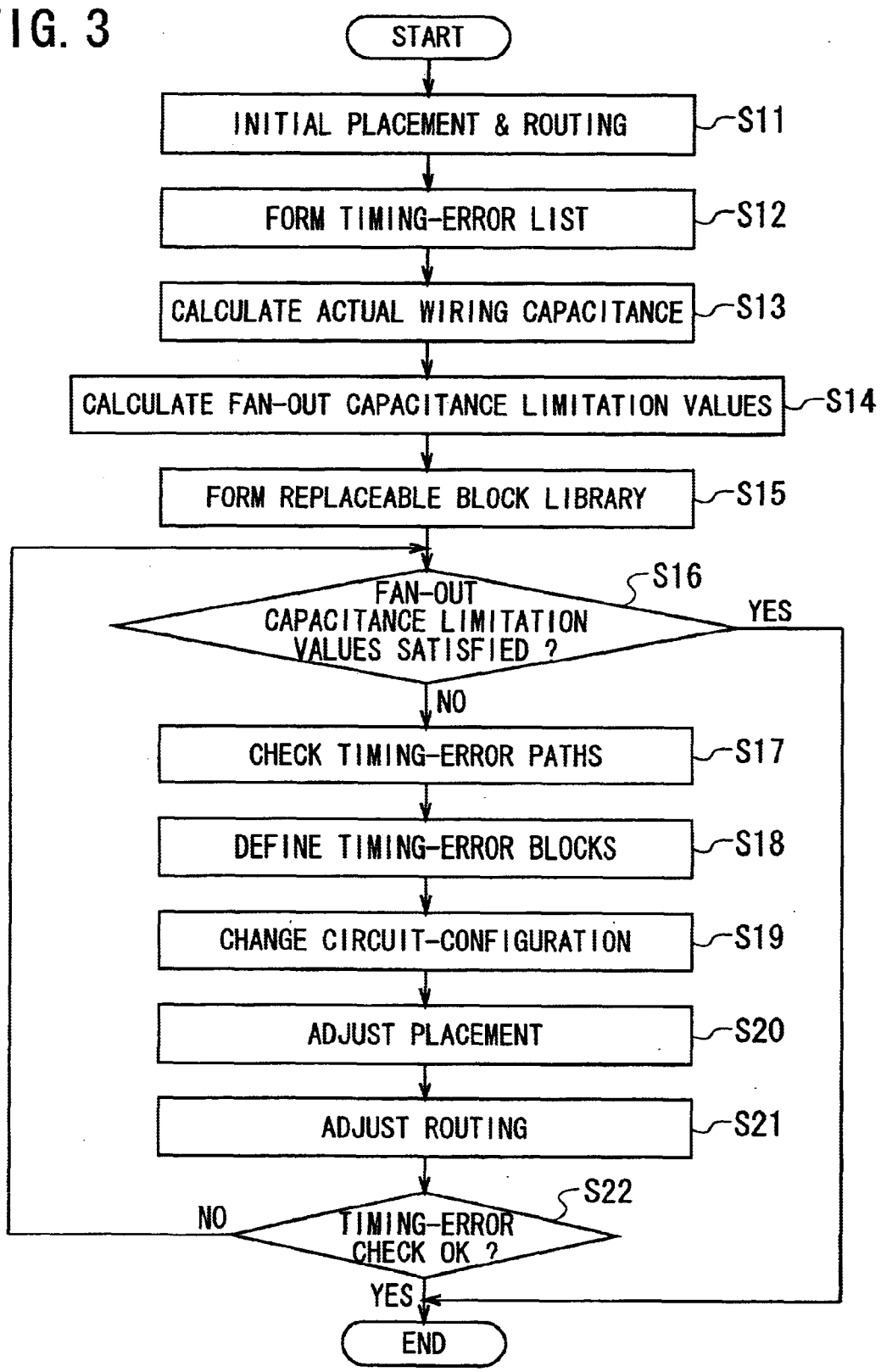
FIG. 3 is a flowchart diagram showing the process flow of a method of performing timing-driven layout of a LSI according to a second embodiment of the invention.

FIG. 3 shows a method of performing timing-driven layout of a LSI according to a second embodiment of the invention, which has substantially the same process steps as those in the first embodiment of FIG. 2, except that a timing-error list is formed and used for defining the fan-out error blocks.

If the timing-error list has the block name and the instance name of the timing-error blocks, whether or not each of the functional blocks is included in the timing-error list can be found easily using the block name and the instance name.

The step S11 for initial placement and routing is the same as the step S1 in FIG. 2, in which an "initial layout result" is formed. Not only placement of functional blocks but also routing of wiring lines for these blocks are carried out in the step S11.

In the step S12, a "timing-error list" is formed based on the initial layout result generated in the step S11. Since this step can be performed by a known method, no explanation is presented here.

The step S13 for calculating the actual wiring capacitance values of the blocks is the same as the step S2 in FIG. 2.

The step S14 for calculating the fan-out capacitance limitation values is the same as the step S3 in FIG. 2.

The step S15 for forming a replaceable block library of the replaceable blocks is the same as the step S4 in FIG. 2.

The step S16 for judging whether or not each of the driving capability values of the blocks is satisfied with its fan-out capacitance limitation value is the same as the step S5 in FIG. 2.

In the step S17, the liming error list formed in the step S12 is checked. This is to find the functional blocks having the driving capability values that are dissatisfied with their fan-out capacitance limitation values from the timing-error blocks existing in the timing-error list.

In the step S18, the blocks having the driving capability values that are dissatisfied with their fan-out capacitance limitation values and that are included in the timing-error list are defined as the "timing-error blocks".

The step S19 for changing the circuit configuration of the timing-error blocks is the same as the step S7 in FIG. 2.

The step S20 for adjusting the initial placement of the blocks is the same as the step S8 in FIG. 2.

The step S21 for adjusting the initial routing for the blocks is the same as the step S9 in FIG. 2.

The step S22 for timing error check is the same as the step S10 in FIG. 2.

With the method of the second embodiment of FIG. 3, because of the same reason as shown in the method of the first embodiment of FIG. 2, there are the same advantages as those in the first embodiment.

There is an additional advantage that the number of the "timing-error blocks" is decreased. This is because the blocks having the driving capability values that are dissatisfied with their fan-out capacitance limitation values and included in the timing-error list are defined as the "timing-error blocks" in the step S18. This advantage leads to shortening of time for timing-error convergence.

If the timing-error list includes the failed blocks due to "hold timing error", it is preferred that the circuit configuration of the failed blocks is not changed to increase the operation speed. Instead, a suitable delay block is added to each of the failed blocks to compensate its time delay.

Third Embodiment

Figure 9A:
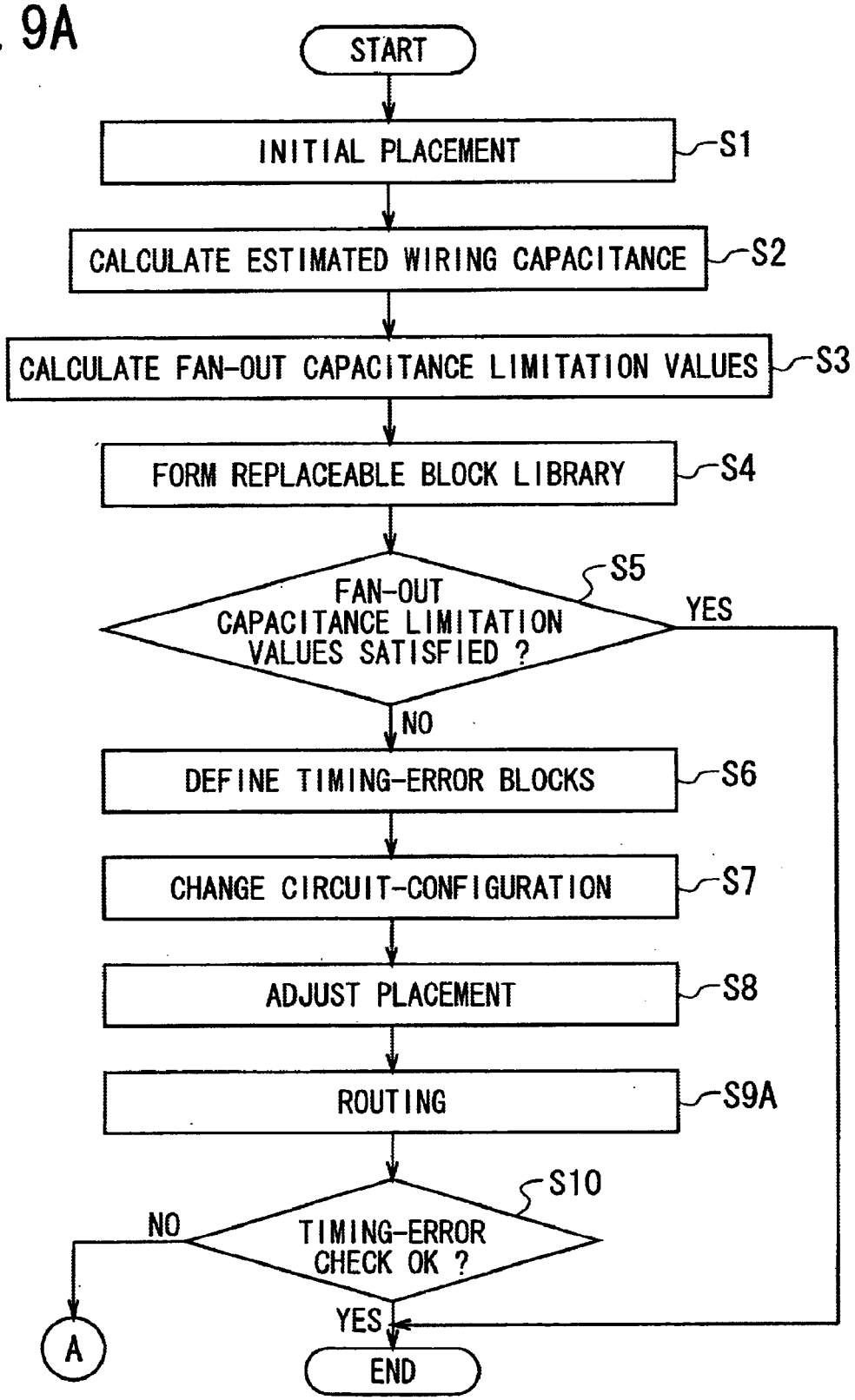
FIGS. 9A and 9B are a flowchart diagram showing the process flow of a method of performing timing-driven layout of a LSI according to a third embodiment of the invention.
Figure 9B:
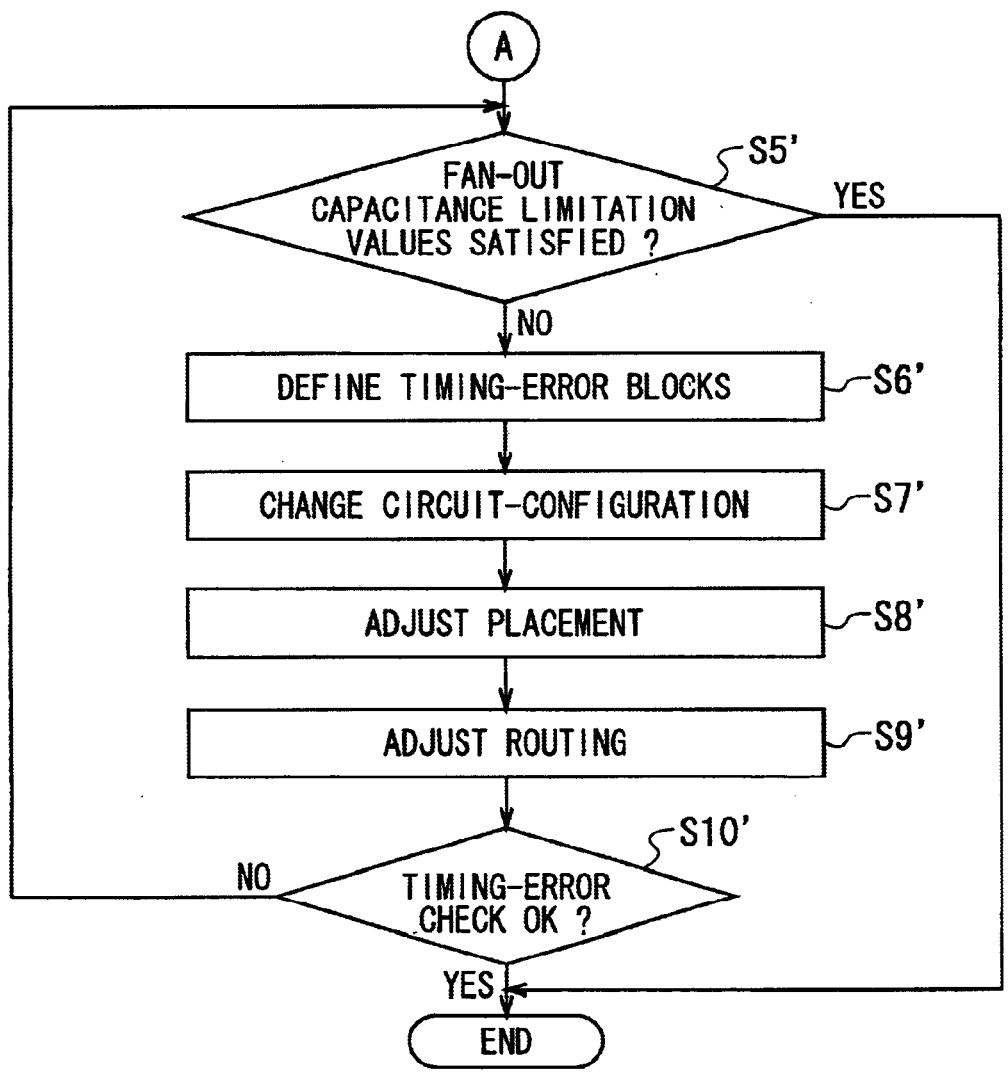

FIGS. 9A and 9B show a method of performing tiring-driven layout of a LSI according to a third embodiment of the invention which has substantially the same process steps as those in the first embodiment of FIG. 2, except that the initial routing is not carried out and that the predictive or estimated wiring capacitance values of the blocks are used instead of the actual wiring capacitance valves.

In the step S1A, initial placement is performed by a known method according to the specific, desired circuit functions or operations of a LSI, thereby forming an "initial layout result". The routing of the wiring lines for these blocks are not carried out in the step S1A. Thus, the initial layout result obtained in the step S1A includes only the placement data of the functional blocks.

In the step S2A, the estimated wiring capacitance of each of the functional blocks thus placed in the step S1A is calculated from the initial layout result obtained in the step S1A.

The steps S3 to S8 are the same as those in the first embodiment of FIG. 2, respectively.

In the step S9A, the initial routing of the wiring lines for the initial functional blocks is carried out to accord with the corrected or changed circuit configuration of the timing-error blocks generated in the step S7.

The step S10 is the same as that in the first embodiment of FIG. 2.

The following steps S5' to S8' are the same as the step S5 to S8, respectively.

The step S9' is the same as the step S9 in FIG. 2.

The step S10' is the same as the step S10 in FIG. 2.

With the method of performing timing-driven layout of a circuit according to the third embodiment, because of substantially the same reason as shown in the method of the first embodiment, there are the same advantages as those of the method of the first embodiment. However, the level of the advantages varies according to the estimation accuracy of the estimated wiring capacitance values in the step S2A.

Fourth Embodiment

Figure 10A:
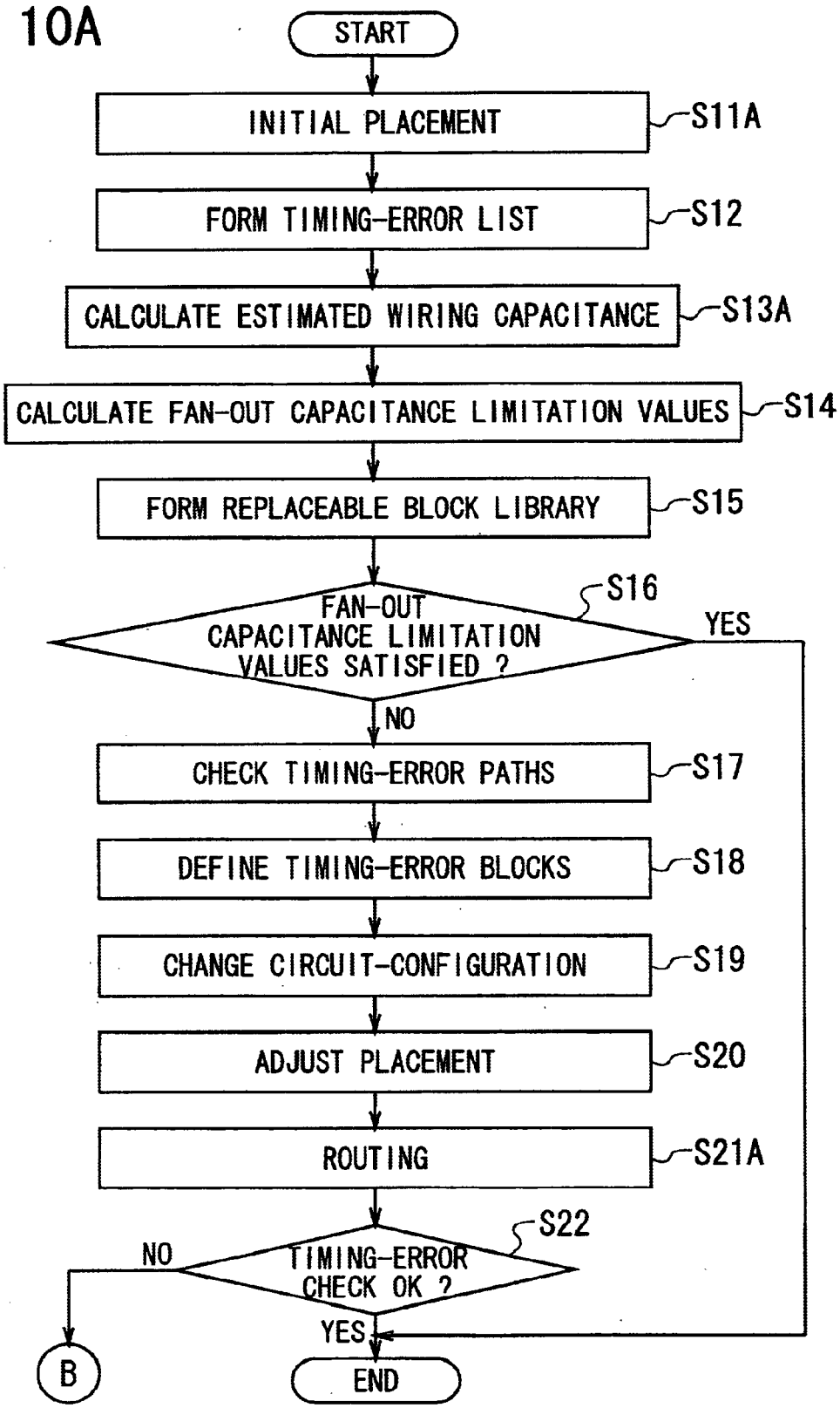
FIGS. 10A and 10B are a flowchart diagram showing the process flow of a method of performing timing-driven layout of a LSI according to a fourth embodiment of the invention.
Figure 10B:
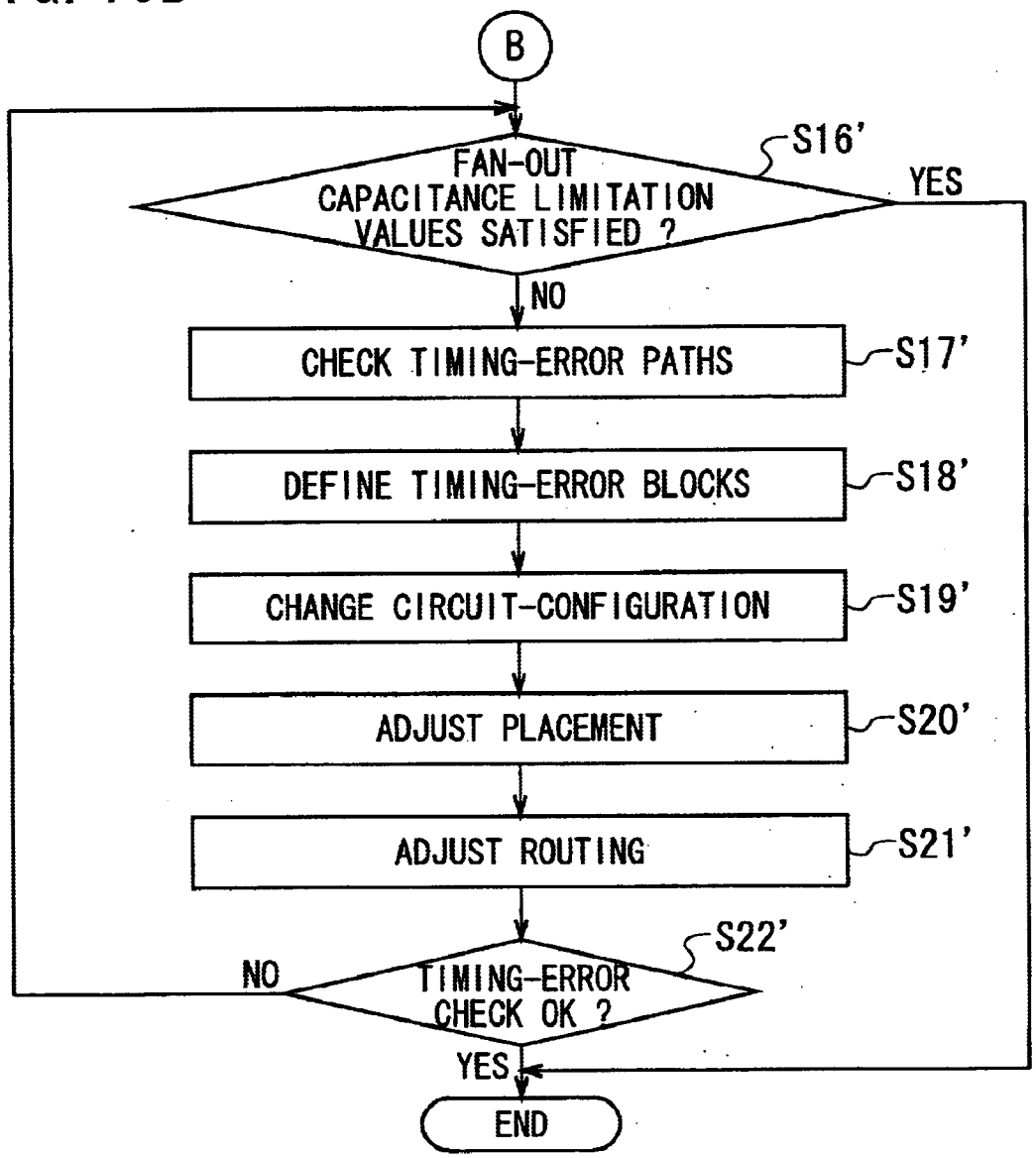

FIGS. 10A and 10B show a method of performing timing-driven layout of a LSI according to a fourth embodiment of the invention, which has substantially the same process steps as those in the second embodiment of FIG. 3, except that the initial routing is not carried out and that the predictive or estimated wiring capacitance values of the blocks are used instead of the actual wiring capacitance values.

In the step S11A, initial placement is performed by a known method according to the specific, desired circuit functions or operations of a LSI, thereby forming an "initial layout result". The routing of the wiring lines for these blocks are not carried out in the step S11A. Thus, the initial layout result obtained in the step S11A includes only the placement data of the functional blocks.

The step S12 is the same as that in the first embodiment of FIG. 2.

In the step S13A, the estimated wiring capacitance of each of the functional blocks thus placed in the step S11A is calculated from the initial layout result obtained in the step S11A.

The steps S14 to S20 are the same as those in the first embodiment of FIG. 2, respectively.

In the step S21A, the initial routing of the wiring lines for the initial functional blocks is carried out to accord with the corrected or changed circuit configuration of the timing-error blocks generated in the step S19.

The step S22 is the same as that in the first embodiment of FIG. 2.

The following steps S16' to S20' are the same as the step S16 to S20, respectively.

The step S21' is the same as the step S21 in FIG. 2.

The step S22' is the same as the step S22.

With the method of performing timing-driven layout of a circuit according to the fourth embodiment, because of substantially the same reason as shown in the method of the second embodiment, there are the same advantages as those of the method of the second embodiment. However, the level of the advantages varies according to the estimation accuracy of the estimated wiring capacitance values in the step S13A.

Variations

Needless to say, the invention is not limited to the above-described embodiments. Any change or modification may be added to these embodiments within the spirit of the invention. For example, the step of checking whether each of the timing-error blocks is located in a high-frequency area of the circuit or LSI or not may be added in one of the above-described first to fourth embodiments. In this case, if the target block in question is located in a high-frequency area of the circuit or LSI, the circuit configuration of the block is changed to minimize its propagation delay. Unlike this, if the target block is not located in a high-frequency area of the circuit or LSI, the circuit configuration of the block is changed to clear its fan-out capacitance limitation value, not to minimize its propagation delay.

Moreover, although the fan-out capacitance limitation value is used to identify the timing-error blocks in the functional blocks in the abode-described embodiments, the invention is not limited to this. Any other parameter (e.g., the propagation delay value) than the fan-out capacitance limitation value may be used for this purpose if it has a correlation with the fan-out capacitance limitation value. For example, if the propagation delay value of 1 ns corresponds to the fan-out capacitance limitation value of 1 pF, the propagation delay value can be used instead of the fan-out capacitance limitation value.

The timing-error list is used to identify the timing-error blocks in the functional blocks in the abode-described embodiments. However, the invention is not limited to this. A signal-integrity error list that includes the functional blocks with a signal-integrity error (e.g., an electro-migration (EM) error and crosstalk) may be used for this purpose.

When the timing-error list is used to identify the timing-error blocks in the functional blocks, some of the functional blocks are dissatisfied with their fan-out capacitance limitation values and are not included in the timing-error list. In this case, it is preferred that the circuit-configuration change of the blocks in question is carried out using the replaceable block library in which the replaceable blocks are arranged in the ascending or descending order of the occupation area values of the blocks (not the propagation delay values).

There is a possibility that even if suitable circuit-configuration change is conducted to the timing-error block, the propagation delay of the block is unable to be decreased as desired due to the dullness of waveform of electrical input signals. Taking this fact into consideration, it is preferred that the "fan-in" capacitance limitation values of the functional blocks are used along with their fan-out capacitance limitation values. In this case, if the block is dissatisfied with its "fan-in" capacitance limitation value, it is subjected to circuit-configuration change even if it is not included in the timing-error list.

While the preferred forms of the present invention has been described, it is to be understood that modifications will be apparent to those skilled in the art without departing from the spirit of the invention. The scope of the present invention, therefore, is to be determined solely by the following claims.

What is claimed is:

1. A method of performing timing-driven layout of a circuit, comprising the steps of:
   (a) generating an initial layout result through placement of functional blocks of the circuit and routing of wiring lines for the blocks;
   (b) calculating wiring capacitance values of the respective blocks using the initial layout result;
   (c) calculating fan-out capacitance limitation values of the respective blocks using the wiring capacitance values of the blocks calculated in the step (b);

each of the fan-out capacitance limitation values representing a maximum fan-out capacitance value of a corresponding one of the blocks at which wiring-induced propagation delay of the block is equal to or less than a specific limitation value;

(d) forming a replaceable block library of replaceable functional blocks while taking their fan-out capacitance limitation values generated in the step (c) into consideration;

the replaceable blocks being divided into different block types each having a same function generated by different circuit configurations;

each of the block types having different propagation delay values and different driving capabilities;

(e) comparing a driving capability of each of the blocks with its fan-out capacitance limitation value, thereby generating a comparison result;

(f) defining the blocks whose driving capabilities do not exceed their fan-out capacitance limitation values as timing-error blocks based on the comparison result; and (g) replacing each of the timing-error blocks with a corresponding one of the replaceable blocks having the same function to change its circuit configuration without changing its function, thereby decreasing its propagation delay.

2. The method according to claim 1, wherein the block types of the replaceable block library are arranged in an ascending or descending order of the propagation delay values.

3. The method according to claim 1, wherein at least part of the block types of a fan-out capacitance limitation library have different driving capabilities.

4. The method according to claim 1, wherein in the step (g), a target block selected from the timing-error blocks is replaced with a first one of the replaceable blocks having a lower driving capability than the target block and then, a second one of the replaceable blocks having a higher driving capability than the target block is added close to the first one of the replaceable blocks;

wherein the second one of the replaceable blocks has a driving capability that covers the fan-out capacitance limitation value of the target block.

5. The method according to claim 1, wherein the driving capability of the timing-error blocks is excessively high compared with the timing-error blocks' fan-out capacitance limitation values, and the driving capability of the timing-error blocks may be reduced while still exceeding the timing-error blocks' fan-out capacitance limitation values;

and wherein the circuit configuration is changed to reduce the driving capability of the timing-error blocks by eliminating an extra element therefrom and/or by reducing their occupation areas.

6. The method according to claim 5, wherein fan-out-error blocks with excessively high driving capability are identified as to whether or not their driving capability value is greater than their fan-out capacitance limitation value to be cleared.

7. A method of performing timing-driven layout of a circuit, comprising the steps of:

(a) generating an initial layout result through placement of functional blocks of the circuit;

(b) estimating wiring capacitance values of the respective blocks using the initial layout result;

(c) calculating fan-out capacitance limitation values of the respective blocks using the wiring capacitance values of the blocks estimated in the step (b);

each of the fan-out capacitance limitation values representing a maximum fan-out capacitance value of a corresponding one of the blocks at which wiring-induced propagation delay of the block is equal to or less than a specific limitation value;

(d) forming a replaceable block library of replaceable functional blocks while taking their fan-out capacitance limitation values of the blocks generated in the step (c) into consideration;

the replaceable blocks being divided into different block types each having a same function generated by different circuit configurations;

each of the block types having different propagation delay values and different driving capabilities;

(e) comparing a driving capability of each of the blocks with its fan-out capacitance limitation value, thereby generating a comparison result;

(f) defining the blocks whose driving capabilities do not exceed their fan-out capacitance limitation values as timing-error blocks based on the comparison result; and (g) replacing each of the timing-error blocks with a corresponding one of the replaceable blocks having the same function to change its circuit configuration without changing its function, thereby decreasing its propagation delay.

8. The method according to claim 7, wherein the block types of the replaceable block library are arranged in an ascending or descending order of the propagation delay values.

9. The method according to claim 7, wherein at least part of the block types of a fan-out capacitance limitation library have different driving capabilities.

10. The method according to claim 7, wherein in the step (g), a target block selected from the timing-error blocks is replaced with a first one of the replaceable blocks having a lower driving capability than the target block and then, a second one of the replaceable blocks having a higher driving capability than the target block is added close to the first one of the replaceable blocks;

wherein the second one of the replaceable blocks has a driving capability that covers the fan-out capacitance limitation value of the target block.

11. The method according to claim 7, wherein the driving capability of the timing-error blocks is excessively high compared with the timing-error blocks' fan-out capacitance limitation values and the driving capability of the timing-error blocks can be reduced while still exceeding the timing error blocks' fan-out capacitance limitation values;

and wherein the circuit configuration is changed to reduce the driving capability of the timing-error blocks by eliminating an extra element therefrom and/or by reducing their occupation areas.

12. The method according to claim 7, wherein fan-out-error blocks with excessively high driving capability are identified as to whether or not their driving capability value is greater than their fan-out capacitance limitation value to be cleared.

13. A computer program product having a computer readable medium and a computer program recorded thereon, the computer program being operable to perform a method of performing timing-driven layout of a circuit, the product comprising:

(a) code that generates an initial layout result through placement of functional blocks of the circuit and routing of wiring lines for the blocks;

(b) code that calculates wiring capacitance values of the respective blocks using the initial layout result;

(c) code that calculates fan-out capacitance limitation values of the respective blocks using the wiring capacitance values of the blocks calculated in the step (b);

each of the fan-out capacitance limitation values representing a maximum fan-out capacitance value of a corresponding one of the blocks at which wiring-induced propagation delay of the block is equal to or less than a specific limitation value;

(d) code that forms a replaceable block library of replaceable functional blocks while taking their fan-out capacitance limitation values of the blocks generated in the step (c) into consideration;

the replaceable blocks being divided into different block types each having a same function generated by different circuit configurations;

each of the block types having different propagation delay values and different driving capabilities;

(e) code that compares a driving capability of each of the blocks with its fan-out capacitance limitation value, thereby generating a comparison result;

(f) code that defines the blocks whose driving capabilities do not exceed their fan-out capacitance limitation values as timing-error blocks based on the comparison result; and (g) code that replaces each of the timing-error blocks with a corresponding one of the replaceable blocks having the same function to change its circuit configuration without changing its function, thereby decreasing its propagation delay.

14. A computer program product having a computer readable medium and a computer program recorded thereon, the computer program being operable to perform a method of performing timing-driven layout of a circuit, the product comprising:

(a) code that generates an initial layout result through placement of functional blocks of the circuit;

(b) code that estimates wiring capacitance values of the respective blocks using the initial layout result;

(c) code that calculates fan-out capacitance limitation values of the respective blocks using the wiring capacitance values of the blocks estimated in the step (b);

each of the fan-out capacitance limitation values representing a maximum fan-out capacitance value of a corresponding one of the blocks at which wiring-induced propagation delay of the block is equal to or less than a specific limitation value;

(d) code that forms a replaceable block library of replaceable functional blocks while taking their fan-out capacitance limitation values of the blocks generated in the step (c) into consideration;

the replaceable blocks being divided into different block types each having a same function generated by different circuit configurations;

each of the block types having different propagation delay values and different driving capabilities;

(e) code that compares a driving capability of each of the blocks with its fan-out capacitance limitation value, thereby generating a comparison result;

(f) code that defines the blocks whose driving capabilities do not exceed their fan-out capacitance limitation values as timing-error blocks based on the comparison result; and (g) code that replaces each of the timing-error blocks with a corresponding one of the replaceable blocks having the same function to change its circuit configuration without changing its function, thereby decreasing its propagation delay.

* * * * *